(12) United States Patent
Kim

(10) Patent No.: US 11,196,400 B2
(45) Date of Patent: Dec. 7, 2021

(54) METHOD FOR CONTROLLING EQUALIZER BASED ON ARTIFICIAL INTELLIGENCE

(71) Applicant: LG ELECTRONICS INC., Seoul (KR)

(72) Inventor: Taehyun Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 17/072,783

(22) Filed: Oct. 16, 2020

(65) Prior Publication Data
US 2021/0211111 A1 Jul. 8, 2021

(30) Foreign Application Priority Data
Jan. 3, 2020 (KR) .......................... 10-2020-0000939

(51) Int. Cl.
| | |
|---|---|
| *H03G 3/00* | (2006.01) |
| *H03G 5/16* | (2006.01) |
| *G06K 9/62* | (2006.01) |
| *G06N 3/08* | (2006.01) |
| *H04R 1/20* | (2006.01) |
| *H04N 5/232* | (2006.01) |
| *H04W 88/02* | (2009.01) |

(52) U.S. Cl.
CPC ............ *H03G 5/165* (2013.01); *G06K 9/6267* (2013.01); *G06N 3/08* (2013.01); *H04R 1/20* (2013.01); *H04N 5/232* (2013.01); *H04W 88/02* (2013.01)

(58) Field of Classification Search
CPC ...................................................... H03G 3/00
See application file for complete search history.

(56) References Cited

U.S. PATENT DOCUMENTS 10,819,844 B2 * 10/2020 Kim ..................... H05B 47/115
2020/0120199 A1 * 4/2020 Maeng ..................... H04L 51/32

* cited by examiner

*Primary Examiner* — Olisa Anwah
(74) *Attorney, Agent, or Firm* — Birch, Stewart, Kolasch & Birch, LLP

(57) ABSTRACT

A method for controlling a mobile terminal, the method including generating a first sound based on first information related to audio output; generating second information related to the audio output based on the first information and features of the first sound; and adjusting a volume or a frequency of a second sound based on the second information and outputting the second sound with adjusted volume or adjusted frequency, in which the first sound comprises a first sub-sound output through a speaker, a second sub-sound output from a case of the mobile terminal that is vibrated by the first sub-sound, and a third sub-sound output by a resting surface that comes in contact with the case of the mobile terminal and is vibrated by vibration of the case of the mobile terminal.

20 Claims, 17 Drawing Sheets

(a)

TRAINING SITUATION

INFERENCE SITUATION (a)

(b)

METHOD FOR CONTROLLING EQUALIZER BASED ON ARTIFICIAL INTELLIGENCE

This application claims the benefit of priority under 35 U.S.C. § 119 to Korean Patent Application No. 10-2020-0000939, filed on Jan. 3, 2020, in the Republic of Korea, the disclosure of which is herein incorporated by reference in its entirety into the present application.

BACKGROUND OF THE DISCLOSURE

Field of the Disclosure

The present disclosure relates to a method for controlling an equalizer based on artificial intelligence.

Related Art

Artificial intelligence technology includes machine learning (deep learning) and element technology that utilizes machine learning.

Machine learning is an algorithm technology in which a machine classifies/learns features from input data by itself. The element technology is intended to simulate human brain functions, such as perception, judgment, and the like, using machine-learning algorithms, such as deep learning, and includes techniques such as linguistic understanding, visual understanding, inference/prediction, knowledge representation, motion control, and the like.

Meanwhile, sound output through a speaker may have different tones depending on equalizing information. An audio output device providing a boombox function using a vibrating medium outputs different sounds depending on the vibrating medium, which are difficult to predict from set equalizing information.

SUMMARY OF THE DISCLOSURE

The present disclosure aims at solving the aforementioned needs and/or problems.

The present disclosure also aims at implementing a method for controlling an equalizer that can output optimal sound regardless of the medium while implementing a boombox function.

The present disclosure also aims at implementing a method for controlling an equalizer that can infer information related to optimal audio output by using an artificial neural network-based learning model.

The present disclosure also aims at implementing a method for controlling an equalizer that can control learning model parameters for adjusting information related to audio output through reinforcement learning.

The present disclosure also aims at implementing a method for controlling an equalizer that can infer the medium of a resting surface that comes in contact with a mobile terminal from an image acquired through a camera and update learning model parameters for adjusting information related to audio output based on the type of the medium of the resting surface.

According to one aspect of the present disclosure, there is provided a sound control method for a mobile terminal including outputting a first sound based on first information related to audio output; generating second information related to audio output based on the first information and the features of the first sound; and outputting a second sound whose volume or frequency is adjusted, based on the second information, in which the first sound comprises a first sub-sound output through a speaker, a second sub-sound output from a case that is vibrated by the first sub-sound, and a third sub-sound output from a resting surface that comes in contact with the case and is vibrated by the vibration of the case.

Furthermore, the first and second information may comprise equalizer parameter values for the first and second sounds.

Furthermore, the features of the first sound may comprise at least one of the pitch, duration, and frequency of the sound.

Furthermore, the generating of second information may include producing an output for applying the first information and the features of the first sound to a neural network-based learning model and determining the second information; and generating the second information based on the output.

Furthermore, the method may further comprise changing the weight or bias for at least one node based on the differences between the first information and the second information, in which the at least one node is comprised in the neural network-based learning model.

Furthermore, the changing of the weight or bias may comprise generating a reward for reinforcement learning based on the difference between the first information and the second information; and changing the weight or bias using the reward.

Furthermore, the learning model may be stored in a memory or in a memory of an AI system capable of communication via a network.

Furthermore, the method may further comprise receiving an image of the resting surface and generating medium information of the resting surface; and assigning the medium information of the resting surface to a learning model matching the medium information.

Furthermore, the image of the resting surface may be received from a camera provided in the mobile terminal or another terminal capable of communication.

Furthermore, the method may further comprise receiving an image of the resting surface; generating medium information of the resting surface from the image; and receiving a particular learning model matching the medium information or the weight or bias for at least one node of the particular learning model.

Furthermore, the receiving of an image of the resting surface may comprise generating a distance value between the mobile terminal and the resting surface through a sensor; and if the distance value is reduced to a set reference value or less, initiating an image receiving process of the camera.

Furthermore, in the generating of second information, if the brightness of the image of the resting surface is reduced to a set reference value or less, a second information generating process may be performed in response to the change in brightness.

According to another aspect of the present disclosure, there is provided a mobile terminal including a case forming the exterior; a speaker that outputs a first sound based on first information related to audio output; and a processor that generates second information related to audio output based on the first information and the features of the first sound and outputs a second sound whose volume or frequency is adjusted, based on the second information, in which the first sound comprises a first sub-sound output through a speaker, a second sub-sound output from a case that is vibrated by the first sub-sound, and a third sub-sound output from a resting surface that comes in contact with the case and is vibrated by the vibration of the case.

The advantageous effects of a method for controlling an equalizer based on artificial intelligence according to an embodiment of the present disclosure are as follows:

One advantage of the present disclosure is to output optimal sound regardless of the medium while implementing a boombox function.

Another advantage of the present disclosure is to infer information related to optimal audio output by using an artificial neural network-based learning model.

Another advantage of the present disclosure is to control learning model parameters for adjusting information related to audio output through reinforcement learning.

Another advantage of the present disclosure is to infer the medium of a resting surface that comes in contact with a mobile terminal from an image acquired through a camera and update learning model parameters for adjusting information related to audio output based on the type of the medium of the resting surface.

Effects which can be acquired by the disclosure are not limited to the above described effects, and other effects that have not been mentioned may be clearly understood by those skilled in the art from the following description.

BRIEF DESCRIPTION OF THE DRAWINGS

A more complete appreciation of the disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Hereinafter, embodiments of the disclosure will be described in detail with reference to the attached drawings. The same or similar components are given the same reference numbers and redundant description thereof is omitted. The suffixes "module" and "unit" of elements herein are used for convenience of description and thus can be used interchangeably and do not have any distinguishable meanings or functions. Further, in the following description, if a detailed description of known techniques associated with the present invention would unnecessarily obscure the gist of the present invention, detailed description thereof will be omitted. In addition, the attached drawings are provided for easy understanding of embodiments of the disclosure and do not limit technical spirits of the disclosure, and the embodiments should be construed as including all modifications, equivalents, and alternatives falling within the spirit and scope of the embodiments.

While terms, such as "first," "second," etc., may be used to describe various components, such components must not be limited by the above terms. The above terms are used only to distinguish one component from another.

When an element is "coupled" or "connected" to another element, it should be understood that a third element may be present between the two elements although the element may be directly coupled or connected to the other element. When an element is "directly coupled" or "directly connected" to another element, it should be understood that no element is present between the two elements.

The singular forms are intended to include the plural forms as well, unless the context clearly indicates otherwise.

In addition, in the specification, it will be further understood that the terms "comprise" and "include" specify the presence of stated features, integers, steps, operations, elements, components, and/or combinations thereof, but do not preclude the presence or addition of one or more other features, integers, steps, operations, elements, components, and/or combinations.

Hereinafter, 5G communication (5th generation mobile communication) used by an apparatus requiring AI processed information and/or an AI processor will be described through paragraphs A through G.

A. Example of block diagram of UE and 5G network

Figure 1:
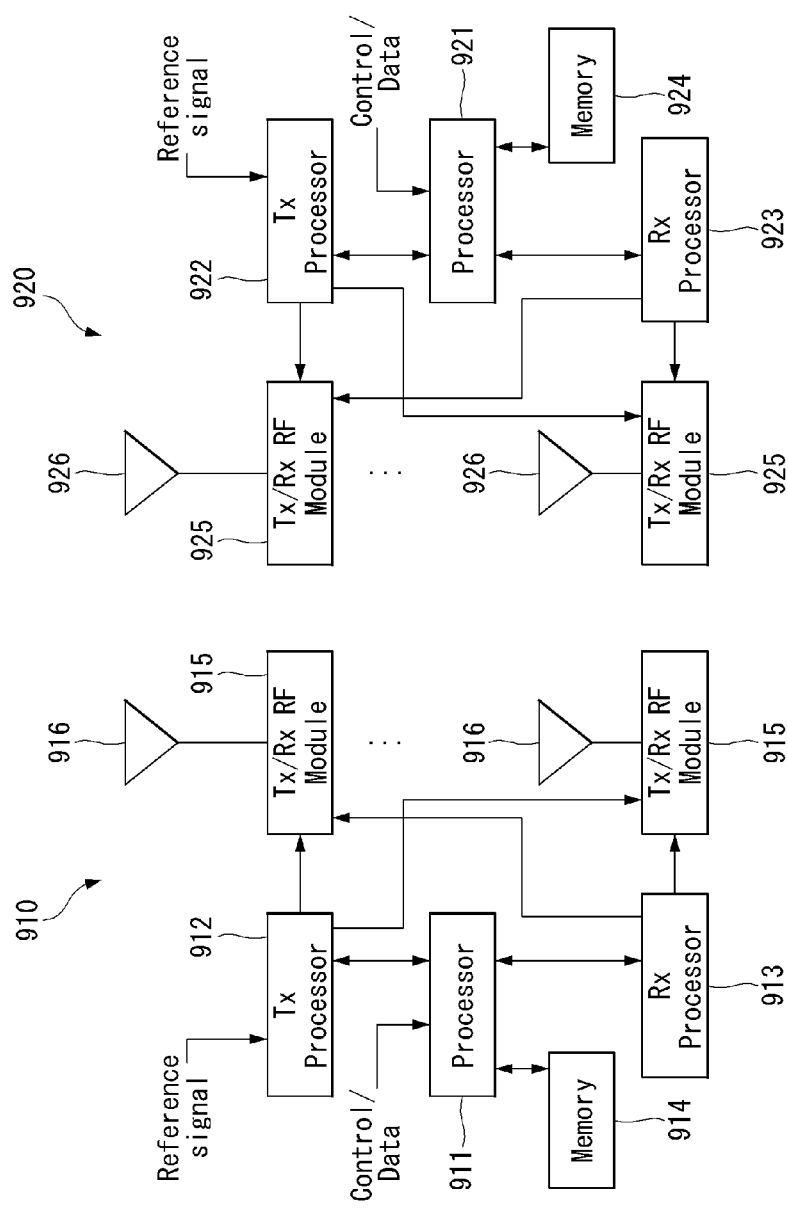
FIG. 1 is a block diagram of a wireless communication system to which methods proposed in the disclosure are applicable according to an embodiment of the present disclosure.

FIG. 1 is a block diagram of a wireless communication system to which methods proposed in the disclosure are applicable.

Referring to FIG. 1, a device (AI device) including an AI module is defined as a first communication device (910 of FIG. 1), and a processor 911 can perform detailed AI operation.

A 5G network including another device (AI server) communicating with the AI device is defined as a second communication device (920 of FIG. 1), and a processor 921 can perform detailed AI operations.

The 5G network may be represented as the first communication device and the AI device may be represented as the second communication device.

For example, the first communication device or the second communication device may be a base station, a network node, a transmission terminal, a reception terminal, a wireless device, a wireless communication device, an autonomous device, or the like.

For example, the first communication device or the second communication device may be a base station, a network node, a transmission terminal, a reception terminal, a wireless device, a wireless communication device, a vehicle, a vehicle having an autonomous function, a connected car, a drone (Unmanned Aerial Vehicle, UAV), and AI (Artificial Intelligence) module, a robot, an AR (Augmented Reality) device, a VR (Virtual Reality) device, an MR (Mixed Reality) device, a hologram device, a public safety device, an MTC device, an IoT device, a medical device, a Fin Tech device (or financial device), a security device, a climate/environment device, a device associated with 5G services, or other devices associated with the fourth industrial revolution field.

For example, a terminal or user equipment (UE) may include a cellular phone, a smart phone, a laptop computer, a digital broadcast terminal, personal digital assistants (PDAs), a portable multimedia player (PMP), a navigation device, a slate PC, a tablet PC, an ULTRABOOK, a wearable device (e.g., a smartwatch, a smart glass and a head mounted display (HMD)), etc. For example, the HMD may be a display device worn on the head of a user. For example, the HMD may be used to realize VR, AR or MR. For example, the drone may be a flying object that flies by wireless control signals without a person therein. For example, the VR device may include a device that implements objects or backgrounds of a virtual world. For example, the AR device may include a device that connects and implements objects or background of a virtual world to objects, backgrounds, or the like of a real world. For example, the MR device may include a device that unites and implements objects or background of a virtual world to objects, backgrounds, or the like of a real world. For example, the hologram device may include a device that implements 360-degree 3D images by recording and playing 3D information using the interference phenomenon of light that is generated by two lasers meeting each other which is called holography. For example, the public safety device may include an image repeater or an imaging device that can be worn on the body of a user. For example, the MTC device and the IoT device may be devices that do not require direct interference or operation by a person. For example, the MTC device and the IoT device may include a smart meter, a bending machine, a thermometer, a smart bulb, a door lock, various sensors, or the like. For example, the medical device may be a device that is used to diagnose, treat, attenuate, remove, or prevent diseases. For example, the medical device may be a device that is used to diagnose, treat, attenuate, or correct injuries or disorders. For example, the medial device may be a device that is used to examine, replace, or change structures or functions. For example, the medical device may be a device that is used to control pregnancy. For example, the medical device may include a device for medical treatment, a device for operations, a device for (external) diagnose, a hearing aid, an operation device, or the like. For example, the security device may be a device that is installed to prevent a danger that is likely to occur and to keep safety. For example, the security device may be a camera, a CCTV, a recorder, a black box, or the like. For example, the Fin Tech device may be a device that can provide financial services such as mobile payment.

Referring to FIG. 1, the first communication device 910 and the second communication device 920 include processors 911 and 921, memories 914 and 924, one or more Tx/Rx radio frequency (RF) modules 915 and 925, Tx processors 912 and 922, Rx processors 913 and 923, and antennas 916 and 926. The Tx/Rx module is also referred to as a transceiver. Each Tx/Rx module 915 transmits a signal through each antenna 926. The processor implements the aforementioned functions, processes and/or methods. The processor 921 may be related to the memory 924 that stores program code and data. The memory may be referred to as a computer-readable medium. More specifically, the Tx processor 912 implements various signal processing functions with respect to L1 (e.g., physical layer) in DL (communication from the first communication device to the second communication device). The Rx processor implements various signal processing functions of L1 (e.g., physical layer).

UL (communication from the second communication device to the first communication device) is processed in the first communication device 910 in a way similar to that described in association with a receiver function in the second communication device 920. Each Tx/Rx module 925 receives a signal through each antenna 926. Each Tx/Rx module provides RF carriers and information to the Rx processor 923. The processor 921 may be related to the memory 924 that stores program code and data. The memory may be referred to as a computer-readable medium.

B. Signal Transmission/Reception Method in Wireless Communication System

Figure 2:
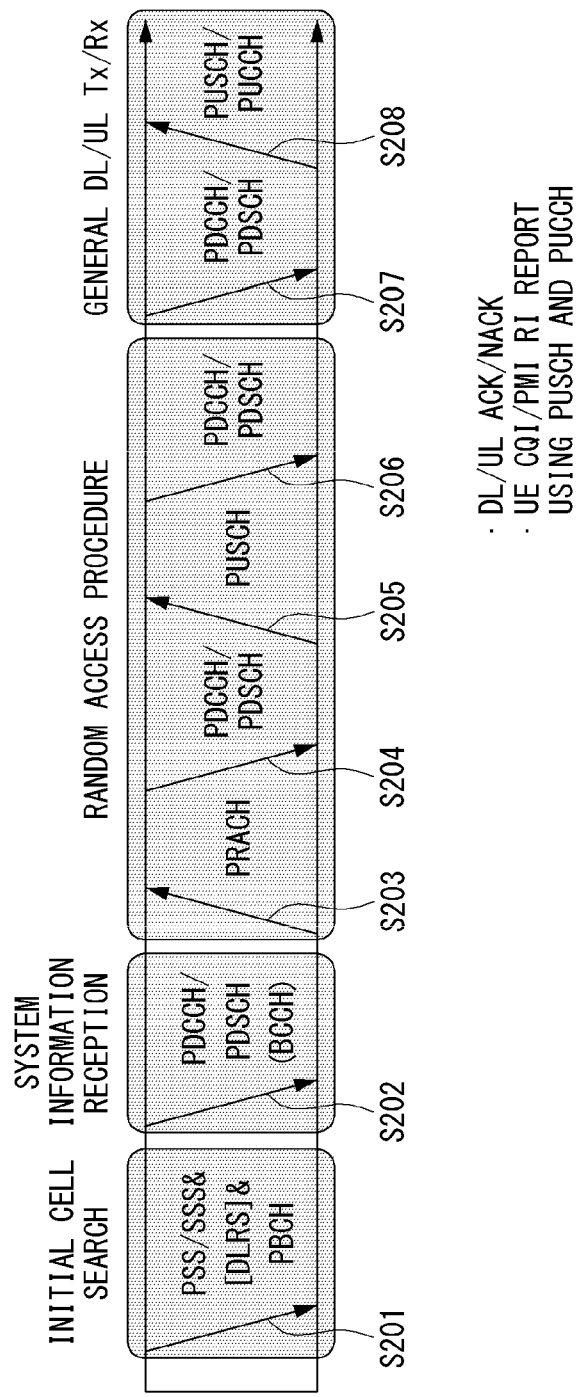
FIG. 2 is a diagram showing an example of a signal transmission/reception method in a wireless communication system according to an embodiment of the present disclosure.

FIG. 2 is a diagram showing an example of a signal transmission/reception method in a wireless communication system.

Referring to FIG. 2, when a UE is powered on or enters a new cell, the UE performs an initial cell search operation such as synchronization with a BS (S201). For this operation, the UE can receive a primary synchronization channel (P-SCH) and a secondary synchronization channel (S-SCH) from the BS to synchronize with the BS and acquire information such as a cell ID. In LTE and NR systems, the P-SCH and S-SCH are respectively called a primary synchronization signal (PSS) and a secondary synchronization signal (SSS). After initial cell search, the UE can acquire broadcast information in the cell by receiving a physical broadcast channel (PBCH) from the BS. Further, the UE can receive a downlink reference signal (DL RS) in the initial cell search step to check a downlink channel state. After initial cell search, the UE can acquire more detailed system information by receiving a physical downlink shared channel (PDSCH)

according to a physical downlink control channel (PDCCH) and information included in the PDCCH (S202).

Meanwhile, when the UE initially accesses the BS or has no radio resource for signal transmission, the UE can perform a random access procedure (RACH) for the BS (steps S203 to S206). To this end, the UE can transmit a specific sequence as a preamble through a physical random access channel (PRACH) (S203 and S205) and receive a random access response (RAR) message for the preamble through a PDCCH and a corresponding PDSCH (S204 and S206). In the case of a contention-based RACH, a contention resolution procedure may be additionally performed.

After the UE performs the above-described process, the UE can perform PDCCH/PDSCH reception (S207) and physical uplink shared channel (PUSCH)/physical uplink control channel (PUCCH) transmission (S208) as normal uplink/downlink signal transmission processes. Particularly, the UE receives downlink control information (DCI) through the PDCCH. The UE monitors a set of PDCCH candidates in monitoring occasions set for one or more control element sets (CORESET) on a serving cell according to corresponding search space configurations. A set of PDCCH candidates to be monitored by the UE is defined in terms of search space sets, and a search space set may be a common search space set or a UE-specific search space set. CORESET includes a set of (physical) resource blocks having a duration of one to three OFDM symbols. A network can configure the UE such that the UE has a plurality of CORESETs. The UE monitors PDCCH candidates in one or more search space sets. Here, monitoring means attempting decoding of PDCCH candidate(s) in a search space. When the UE has successfully decoded one of PDCCH candidates in a search space, the UE determines that a PDCCH has been detected from the PDCCH candidate and performs PDSCH reception or PUSCH transmission based on DCI in the detected PDCCH. The PDCCH can be used to schedule DL transmissions over a PDSCH and UL transmissions over a PUSCH. Here, the DCI in the PDCCH includes downlink assignment (e.g., downlink grant (DL grant)) related to a physical downlink shared channel and including at least a modulation and coding format and resource allocation information, or an uplink grant (UL grant) related to a physical uplink shared channel and including a modulation and coding format and resource allocation information.

An initial access (IA) procedure in a 5G communication system will be additionally described with reference to FIG. 2.

The UE can perform cell search, system information acquisition, beam alignment for initial access, and DL measurement based on an SSB. The SSB is interchangeably used with a synchronization signal/physical broadcast channel (SS/PBCH) block.

The SSB includes a PSS, an SSS and a PBCH. The SSB is configured in four consecutive OFDM symbols, and a PSS, a PBCH, an SSS/PBCH or a PBCH is transmitted for each OFDM symbol. Each of the PSS and the SSS includes one OFDM symbol and 127 subcarriers, and the PBCH includes 3 OFDM symbols and 576 subcarriers.

Cell search refers to a process in which a UE acquires time/frequency synchronization of a cell and detects a cell identifier (ID) (e.g., physical layer cell ID (PCI)) of the cell. The PSS is used to detect a cell ID in a cell ID group and the SSS is used to detect a cell ID group. The PBCH is used to detect an SSB (time) index and a half-frame.

There are 336 cell ID groups and there are 3 cell IDs per cell ID group. A total of 1008 cell IDs are present. Information on a cell ID group to which a cell ID of a cell belongs is provided/acquired through an SSS of the cell, and information on the cell ID among 336 cell ID groups is provided/acquired through a PSS.

The SSB is periodically transmitted in accordance with SSB periodicity. A default SSB periodicity assumed by a UE during initial cell search is defined as 20 ms. After cell access, the SSB periodicity can be set to one of {5 ms, 10 ms, 20 ms, 40 ms, 80 ms, 160 ms} by a network (e.g., a BS).

Next, acquisition of system information (SI) will be described.

SI is divided into a master information block (MIB) and a plurality of system information blocks (SIBs). SI other than the MIB may be referred to as remaining minimum system information. The MIB includes information/parameter for monitoring a PDCCH that schedules a PDSCH carrying SIB1 (SystemInformationBlock1) and is transmitted by a BS through a PBCH of an SSB. SIB1 includes information related to availability and scheduling (e.g., transmission periodicity and SI-window size) of the remaining SIBs (hereinafter, SIBx, x is an integer equal to or greater than 2). SiBx is included in an SI message and transmitted over a PDSCH. Each SI message is transmitted within a periodically generated time window (e.g., SI-window).

A random access (RA) procedure in a 5G communication system will be additionally described with reference to FIG. 2.

A random access procedure is used for various purposes. For example, the random access procedure can be used for network initial access, handover, and UE-triggered UL data transmission. A UE can acquire UL synchronization and UL transmission resources through the random access procedure. The random access procedure is classified into a contention-based random access procedure and a contention-free random access procedure. A detailed procedure for the contention-based random access procedure is as follows.

A UE can transmit a random access preamble through a PRACH as Msg1 of a random access procedure in UL. Random access preamble sequences having different two lengths are supported. A long sequence length 839 is applied to subcarrier spacings of 1.25 kHz and 5 kHz and a short sequence length 139 is applied to subcarrier spacings of 15 kHz, 30 kHz, 60 kHz and 120 kHz.

When a BS receives the random access preamble from the UE, the BS transmits a random access response (RAR) message (Msg2) to the UE. A PDCCH that schedules a PDSCH carrying a RAR is CRC masked by a random access (RA) radio network temporary identifier (RNTI) (RA-RNTI) and transmitted. Upon detection of the PDCCH masked by the RA-RNTI, the UE can receive a RAR from the PDSCH scheduled by DCI carried by the PDCCH. The UE checks whether the RAR includes random access response information with respect to the preamble transmitted by the UE, that is, Msg1. Presence or absence of random access information with respect to Msg1 transmitted by the UE can be determined according to presence or absence of a random access preamble ID with respect to the preamble transmitted by the UE. If there is no response to Msg1, the UE can retransmit the RACH preamble less than a predetermined number of times while performing power ramping. The UE calculates PRACH transmission power for preamble retransmission based on most recent pathloss and a power ramping counter.

The UE can perform UL transmission through Msg3 of the random access procedure over a physical uplink shared channel based on the random access response information. Msg3 can include an RRC connection request and a UE ID.

The network can transmit Msg4 as a response to Msg3, and Msg4 can be handled as a contention resolution message on DL. The UE can enter an RRC connected state by receiving Msg4.

C. Beam Management (BM) Procedure of 5G Communication System

A BM procedure can be divided into (1) a DL MB procedure using an SSB or a CSI-RS and (2) a UL BM procedure using a sounding reference signal (SRS). In addition, each BM procedure can include Tx beam swiping for determining a Tx beam and Rx beam swiping for determining an Rx beam.

The DL BM procedure using an SSB will be described.

Configuration of a beam report using an SSB is performed when channel state information (CSI)/beam is configured in RRC_CONNECTED.

- A UE receives a CSI-ResourceConfig IE including CSI-SSB-ResourceSetList for SSB resources used for BM from a BS. The RRC parameter "csi-SSB-Resource-SetList" represents a list of SSB resources used for beam management and report in one resource set. Here, an SSB resource set can be set as {SSBx1, SSBx2, SSBx3, SSBx4, . . . }. An SSB index can be defined in the range of 0 to 63.
- The UE receives the signals on SSB resources from the BS based on the CSI-SSB-ResourceSetList.
- When CSI-RS reportConfig with respect to a report on SSBRI and reference signal received power (RSRP) is set, the UE reports the best SSBRI and RSRP corresponding thereto to the BS. For example, when reportQuantity of the CSI-RS reportConfig IE is set to 'ssb-Index-RSRP', the UE reports the best SSBRI and RSRP corresponding thereto to the BS.

When a CSI-RS resource is configured in the same OFDM symbols as an SSB and 'QCL-TypeD' is applicable, the UE can assume that the CSI-RS and the SSB are quasi co-located (QCL) from the viewpoint of 'QCL-TypeD'. Here, QCL-TypeD may mean that antenna ports are quasi co-located from the viewpoint of a spatial Rx parameter. When the UE receives signals of a plurality of DL antenna ports in a QCL-TypeD relationship, the same Rx beam can be applied.

Next, a DL BM procedure using a CSI-RS will be described.

An Rx beam determination (or refinement) procedure of a UE and a Tx beam swiping procedure of a BS using a CSI-RS will be sequentially described. A repetition parameter is set to 'ON' in the Rx beam determination procedure of a UE and set to 'OFF' in the Tx beam swiping procedure of a BS.

First, the Rx beam determination procedure of a UE will be described.

- The UE receives an NZP CSI-RS resource set IE including an RRC parameter with respect to 'repetition' from a BS through RRC signaling. Here, the RRC parameter 'repetition' is set to 'ON'.
- The UE repeatedly receives signals on resources in a CSI-RS resource set in which the RRC parameter 'repetition' is set to 'ON' in different OFDM symbols through the same Tx beam (or DL spatial domain transmission filters) of the BS.
- The UE determines an RX beam thereof.
- The UE skips a CSI report. That is, the UE can skip a CSI report when the RRC parameter 'repetition' is set to 'ON'.

Next, the Tx beam determination procedure of a BS will be described.

- A UE receives an NZP CSI-RS resource set IE including an RRC parameter with respect to 'repetition' from the BS through RRC signaling. Here, the RRC parameter 'repetition' is related to the Tx beam swiping procedure of the BS when set to 'OFF'.
- The UE receives signals on resources in a CSI-RS resource set in which the RRC parameter 'repetition' is set to 'OFF' in different DL spatial domain transmission filters of the BS.
- The UE selects (or determines) a best beam.
- The UE reports an ID (e.g., CRI) of the selected beam and related quality information (e.g., RSRP) to the BS. That is, when a CSI-RS is transmitted for BM, the UE reports a CRI and RSRP with respect thereto to the BS.

Next, the UL BM procedure using an SRS will be described.

- A UE receives RRC signaling (e.g., SRS-Config IE) including a (RRC parameter) purpose parameter set to 'beam management" from a BS. The SRS-Config IE is used to set SRS transmission. The SRS-Config IE includes a list of SRS-Resources and a list of SRS-ResourceSets. Each SRS resource set refers to a set of SRS-resources.
- The UE determines Tx beamforming for SRS resources to be transmitted based on SRS-SpatialRelation Info included in the SRS-Config IE. Here, SRS-SpatialRelation Info is set for each SRS resource and indicates whether the same beamforming as that used for an SSB, a CSI-RS or an SRS will be applied for each SRS resource.
- When SRS-SpatialRelationInfo is set for SRS resources, the same beamforming as that used for the SSB, CSI-RS or SRS is applied. However, when SRS-SpatialRelationInfo is not set for SRS resources, the UE arbitrarily determines Tx beamforming and transmits an SRS through the determined Tx beamforming.

Next, a beam failure recovery (BFR) procedure will be described.

In a beamformed system, radio link failure (RLF) may frequently occur due to rotation, movement or beamforming blockage of a UE. Accordingly, NR supports BFR in order to prevent frequent occurrence of RLF. BFR is similar to a radio link failure recovery procedure and can be supported when a UE knows new candidate beams. For beam failure detection, a BS configures beam failure detection reference signals for a UE, and the UE declares beam failure when the number of beam failure indications from the physical layer of the UE reaches a threshold set through RRC signaling within a period set through RRC signaling of the BS. After beam failure detection, the UE triggers beam failure recovery by initiating a random access procedure in a PCell and performs beam failure recovery by selecting a suitable beam. (When the BS provides dedicated random access resources for certain beams, these are prioritized by the UE). Completion of the aforementioned random access procedure is regarded as completion of beam failure recovery.

D. URLLC (Ultra-Reliable and Low Latency Communication)

URLLC transmission defined in NR can refer to (1) a relatively low traffic size, (2) a relatively low arrival rate, (3) extremely low latency requirements (e.g., 0.5 and 1 ms), (4) relatively short transmission duration (e.g., 2 OFDM symbols), (5) urgent services/messages, etc. In the case of UL, transmission of traffic of a specific type (e.g., URLLC) needs to be multiplexed with another transmission (e.g., eMBB) scheduled in advance in order to satisfy more stringent latency requirements. In this regard, a method of providing information indicating preemption of specific resources to a UE scheduled in advance and allowing a URLLC UE to use the resources for UL transmission is provided.

NR supports dynamic resource sharing between eMBB and URLLC. eMBB and URLLC services can be scheduled on non-overlapping time/frequency resources, and URLLC transmission can occur in resources scheduled for ongoing eMBB traffic. An eMBB UE may not ascertain whether PDSCH transmission of the corresponding UE has been partially punctured and the UE may not decode a PDSCH due to corrupted coded bits. In view of this, NR provides a preemption indication. The preemption indication may also be referred to as an interrupted transmission indication.

With regard to the preemption indication, a UE receives DownlinkPreemption IE through RRC signaling from a BS. When the UE is provided with DownlinkPreemption IE, the UE is configured with INT-RNTI provided by a parameter int-RNTI in DownlinkPreemption IE for monitoring of a PDCCH that conveys DCI format 2_1. The UE is additionally configured with a corresponding set of positions for fields in DCI format 2_1 according to a set of serving cells and positionInDCI by INT-ConfigurationPerServing Cell including a set of serving cell indexes provided by serving-CellID, configured having an information payload size for DCI format 2_1 according to dci-Payloadsize, and configured with indication granularity of time-frequency resources according to timeFrequency Sect.

The UE receives DCI format 2_1 from the BS based on the DownlinkPreemption IE.

When the UE detects DCI format 2_1 for a serving cell in a configured set of serving cells, the UE can assume that there is no transmission to the UE in PRBs and symbols indicated by the DCI format 2_1 in a set of PRBs and a set of symbols in a last monitoring period before a monitoring period to which the DCI format 2_1 belongs. For example, the UE assumes that a signal in a time-frequency resource indicated according to preemption is not DL transmission scheduled therefor and decodes data based on signals received in the remaining resource region.

E. mMTC (Massive MTC)

mMTC (massive Machine Type Communication) is one of 5G scenarios for supporting a hyper-connection service providing simultaneous communication with a large number of UEs. In this environment, a UE intermittently performs communication with a very low speed and mobility. Accordingly, a main goal of mMTC is operating a UE for a long time at a low cost. With respect to mMTC, 3GPP deals with MTC and NB (NarrowBand)-IoT.

mMTC has features such as repetitive transmission of a PDCCH, a PUCCH, a PDSCH (physical downlink shared channel), a PUSCH, etc., frequency hopping, retuning, and a guard period.

That is, a PUSCH (or a PUCCH (particularly, a long PUCCH) or a PRACH) including specific information and a PDSCH (or a PDCCH) including a response to the specific information are repeatedly transmitted. Repetitive transmission is performed through frequency hopping, and for repetitive transmission, (RF) retuning from a first frequency resource to a second frequency resource is performed in a guard period and the specific information and the response to the specific information can be transmitted/received through a narrowband (e.g., 6 resource blocks (RBs) or 1 RB).

F. Basic Operation Between User Equipment Using 5G Communication

Figure 3:
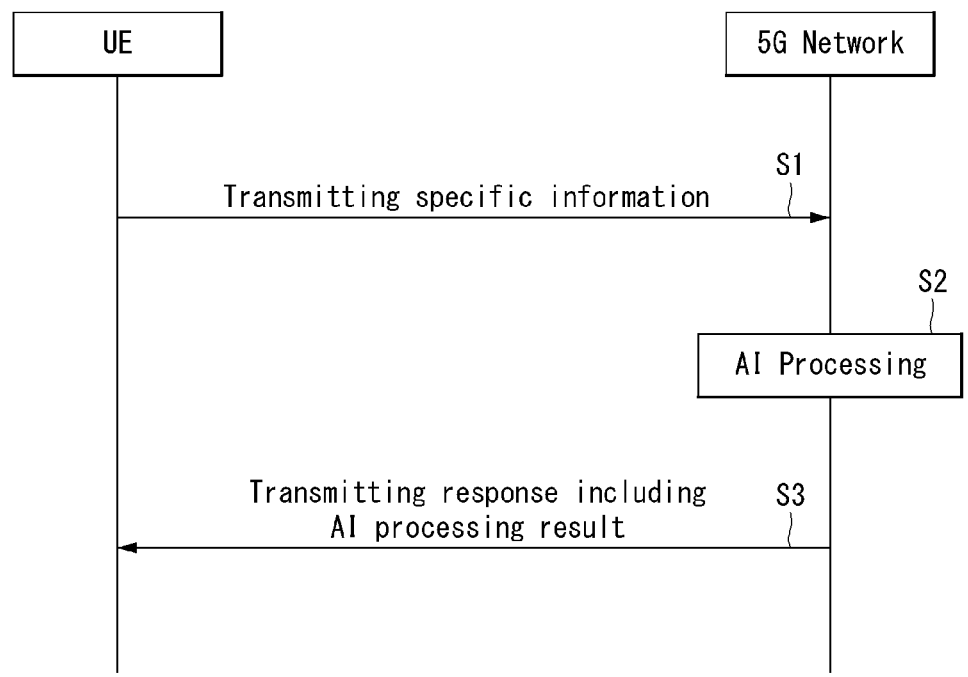
FIG. 3 shows an example of basic operations of an autonomous vehicle and a 5G network in a 5G communication system according to an embodiment of the present disclosure.

FIG. 3 shows an example of basic operations of a user equipment and a 5G network in a 5G communication system.

The user equipment transmits specific information to the 5G network (S1). The specific information may include autonomous driving related information. In addition, the 5G network can determine whether to remotely control the vehicle (S2). Here, the 5G network may include a server or a module which performs remote control related to autonomous driving. In addition, the 5G network can transmit information (or signal) related to remote control to the user equipment (S3).

G. Applied Operations Between User Equipment and 5G Network in 5G Communication System Hereinafter, the operation of a user equipment using 5G communication will be described in more detail with reference to wireless communication technology (BM procedure, URLLC, mMTC, etc.) described in FIGS. 1 and 2.

First, a basic procedure of an applied operation to which a method proposed by the present invention which will be described later and eMBB of 5G communication are applied will be described.

As in steps S1 and S3 of FIG. 3, the user equipment performs an initial access procedure and a random access procedure with the 5G network prior to step S1 of FIG. 3 in order to transmit/receive signals, information and the like to/from the 5G network.

More specifically, the user equipment performs an initial access procedure with the 5G network based on an SSB in order to acquire DL synchronization and system information. A beam management (BM) procedure and a beam failure recovery procedure may be added in the initial access procedure, and quasi-co-location (QCL) relation may be added in a process in which the user equipment receives a signal from the 5G network.

In addition, the user equipment performs a random access procedure with the 5G network for UL synchronization acquisition and/or UL transmission. The 5G network can transmit, to the user equipment, a UL grant for scheduling transmission of specific information. Accordingly, the user equipment transmits the specific information to the 5G network based on the UL grant. In addition, the 5G network transmits, to the user equipment, a DL grant for scheduling transmission of 5G processing results with respect to the specific information. Accordingly, the 5G network can transmit, to the user equipment, information (or a signal) related to remote control based on the DL grant.

Next, a basic procedure of an applied operation to which a method proposed by the present invention which will be described later and URLLC of 5G communication are applied will be described.

As described above, a user equipment can receive DownlinkPreemption IE from the 5G network after the user equipment performs an initial access procedure and/or a random access procedure with the 5G network. Then, the user equipment receives DCI format 2_1 including a preemption indication from the 5G network based on DownlinkPreemption IE. The user equipment does not perform (or expect or assume) reception of eMBB data in resources (PRBs and/or OFDM symbols) indicated by the preemption indication. Thereafter, when the user equipment needs to transmit specific information, the user equipment can receive a UL grant from the 5G network.

Next, a basic procedure of an applied operation to which a method proposed by the present invention which will be described later and mMTC of 5G communication are applied will be described.

Description will focus on parts in the steps of FIG. 3 which are changed according to application of mMTC.

In step S1 of FIG. 3, the user equipment receives a UL grant from the 5G network in order to transmit specific information to the 5G network. Here, the UL grant may include information on the number of repetitions of transmission of the specific information and the specific information may be repeatedly transmitted based on the information on the number of repetitions. That is, the user equipment transmits the specific information to the 5G network based on the UL grant. Repetitive transmission of the specific information may be performed through frequency hopping, the first transmission of the specific information may be performed in a first frequency resource, and the second transmission of the specific information may be performed in a second frequency resource. The specific information can be transmitted through a narrowband of 6 resource blocks (RBs) or 1 RB.

The above-described 5G communication technology can be combined with methods proposed in the present invention which will be described later and applied or can complement the methods proposed in the present invention to make technical features of the methods concrete and clear.

Figure 4:
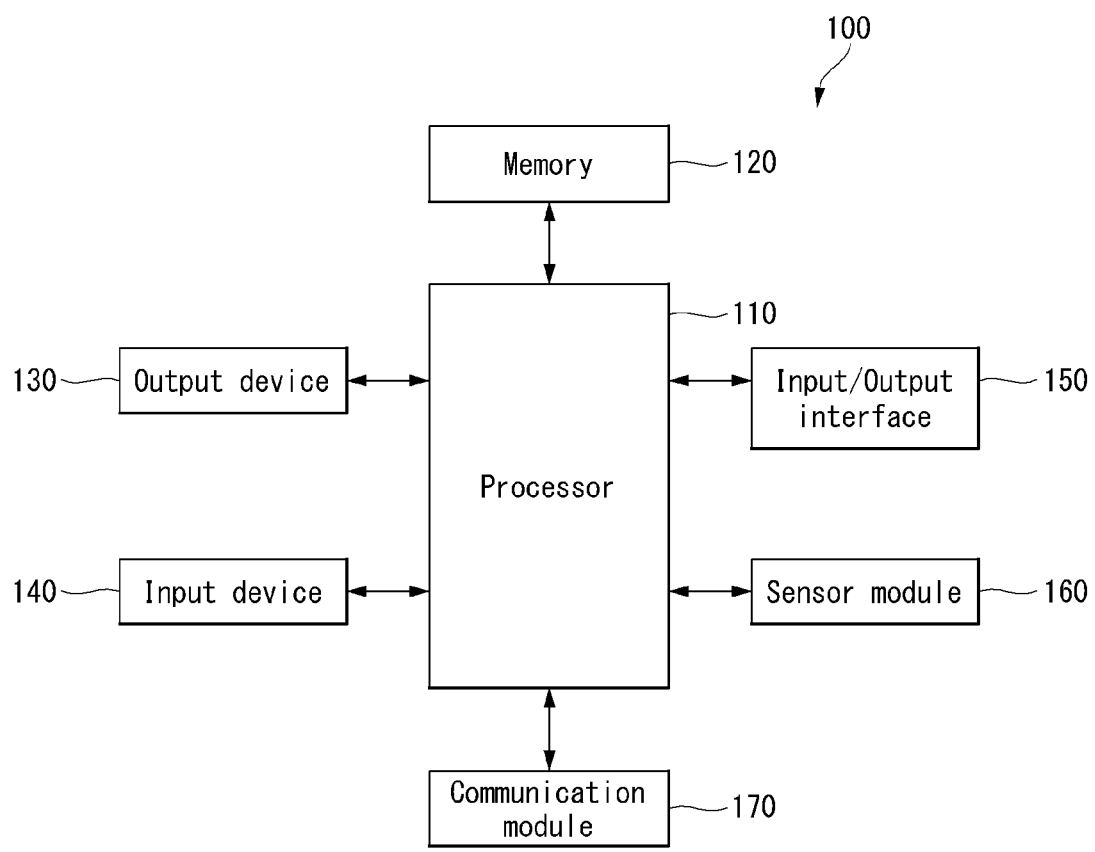
FIG. 4 is a diagram illustrating a block diagram of an electronic device according to an embodiment of the present disclosure.

FIG. 4 is a diagram illustrating a block diagram of an electronic device.

Referring to FIG. 4, an electronic device 100 may include at least one processor 110, a memory 120, an output device 130, an input device 140, an input/output interface 150, a sensor module 160, and a communication module 170.

The processor 110 may include one or more application processors (AP), one or more communication processors (CP), or at least one or more artificial intelligence processors (AI processors). The application processor, the communication processor, or the AI processor may be included in different integrated circuit (IC) packages, respectively, or may be included in one IC package.

The application processor may run an operating system or an application program to control a plurality of hardware or software components connected to the application processor, and perform various data processing/operations including multimedia data. As an example, the application processor may be implemented as a system on chip (SoC). The processor 110 may further include a graphic processing unit (GPU).

The communication processor may perform functions of managing data links and converting a communication protocol in communication between the electronic device 100 and other electronic devices connected through a network. As an example, the communication processor may be implemented as an SoC. The communication processor may perform at least some of the multimedia control functions.

In addition, the communication processor may control data transmission and reception of the communication module 170. The communication processor may be implemented to be included as at least a part of the application processor.

The application processor or the communication processor may load and process a command or data received from at least one of a nonvolatile memory or other components connected to each to a volatile memory. Also, the application processor or the communication processor may store data received from at least one of the other components or generated by at least one of the other components in the nonvolatile memory.

The memory 120 may include an internal memory or an external memory. The internal memory may include at least one of the volatile memory (for example, dynamic RAM (DRAM), static RAM (SRAM), synchronous dynamic RAM (SDRAM), etc.) or the nonvolatile memory (for example, one time programmable ROM (OTPROM), programmable ROM (PROM), erasable and programmable ROM (EPROM), electrically erasable and programmable ROM (EEPROM), mask ROM, flash ROM, NAND flash memory, NOR flash memory, etc.). According to an embodiment, the internal memory may take the form of a solid state drive (SSD). The external memory may further include a flash drive, for example, compact flash (CF), secure digital (SD), micro secure digital (Micro-SD), mini secure digital (Mini-SD), and extreme digital (xD) or a memory stick, etc.

The output device 130 may include at least one or more of a display module and a speaker. The output device 130 may display various types of data including multimedia data, text data, voice data, and the like to a user or output it as sound.

The input device 140 may include a touch panel, a digital pen sensor, a key, or an ultrasonic input device, etc. For example, the input device 140 may be the input/output interface 150. The touch panel may recognize a touch input using at least one of a capacitive type, a pressure sensitive type, an infrared type, or an ultrasonic type. In addition, the touch panel may further include a controller. In the case of capacitive type, not only direct touch but also proximity recognition is possible. The touch panel may further include a tactile layer. In this case, the touch panel may provide a tactile reaction to the user.

The digital pen sensor may be implemented using the same or similar method as receiving a user's touch input, or using a separate recognition layer. Keys may be keypads or touch keys. The ultrasonic input device is a device that can check data by detecting a micro sound wave in a terminal through a pen that generates an ultrasonic signal, and is capable of wireless recognition. The electronic device 100 may receive a user input from an external device (e.g., a network, a computer, or a server) connected thereto by using the communication module 170.

The input device 140 may further include a camera module and a microphone. The camera module is a device capable of capturing images and moving pictures, and may include one or more image sensors, an image signal processor (ISP), or a flash LED. The microphone may receive an audio signal and convert it into an electrical signal.

The input/output interface 150 may transmit commands or data input from the user through the input device or the output device to the processor 110, the memory 120, the communication module 170, etc. through a bus. For example, the input/output interface 150 may provide data on a user's touch input entered through the touch panel to the processor 110. For example, the input/output interface 150 may output commands or data received from the processor 110, the memory 120, the communication module 170, etc. through the bus through the output device 130. For example, the input/output interface 150 may output voice data processed through the processor 110 to the user through the speaker.

The sensor module 160 may include at least one of a gesture sensor, a gyro sensor, an atmospheric pressure sensor, a magnetic sensor, an acceleration sensor, a grip sensor, a proximity sensor, an RGB (red, green, blue) sensor, a biometric sensor, a temperature/humidity sensor, an illuminance sensor and an ultra violet (UV) sensor. The sensor module 160 may measure a physical quantity or detect an operating state of the electronic device 100 and convert the measured or detected information into an electric signal. Additionally or alternatively, the sensor module 160 may include an olfactory sensor (E-nose sensor), an EMG sensor (electromyography sensor), an EEG sensor (electroencephalogram sensor), an ECG sensor (electrocardiogram sensor), a PPG sensor (photoplethysmography sensor), a heart rate monitor sensor (FIRM), a perspiration sensor or a fingerprint sensor, etc. The sensor module 160 may further include a control circuit for controlling at least one or more sensors included therein.

The communication module 170 may include a wireless communication module or an RF module. The wireless communication module may include, for example, Wi-Fi, BT, GPS or NFC. For example, the wireless communication module may provide a wireless communication function using a radio frequency. Additionally or alternatively, the wireless communication module may include a network interface or modem for connecting the electronic device 100 to a network (example: internet, LAN, WAN, telecommunication network, cellular network, satellite network, POTS or 5G network, etc.).

The RF module may be responsible for transmission and reception of data, for example, transmission and reception of RF signals or called electronic signals. For example, the RF module may include a transceiver, a power amp module (PAM), a frequency filter or a low noise amplifier (LNA), etc. In addition, the RF module may further include components for transmitting and receiving an electromagnetic wave in a free space in wireless communication, for example, a conductor or a wire.

The electronic device 100 according to various embodiments of the present disclosure may include at least one of a server, a TV, a refrigerator, an oven, a clothing styler, a robot cleaner, a drone, an air conditioner, an air cleaner, a PC, a speaker, a home CCTV, a lighting, a washing machine and a smart plug. Since the components of the electronic device 100 described in FIG. 4 are examples of components generally included in the electronic device, the electronic device 100 according to the embodiment of the present disclosure is not limited to the above-described components, and may be omitted and/or added as necessary.

Figure 5:
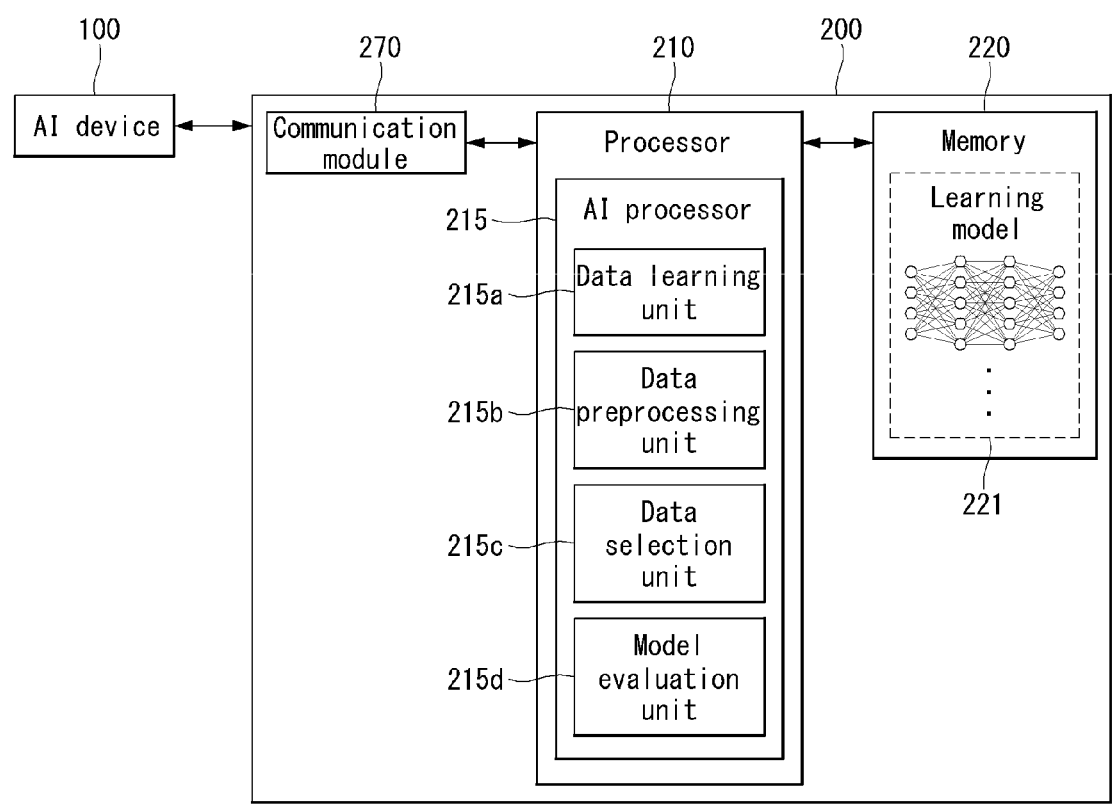
FIG. 5 illustrates a schematic block diagram of an AI server according to an embodiment of the present disclosure.

The electronic device 100 may perform an artificial intelligence-based control operation by receiving the AI processing result from the cloud environment shown in FIG. 5 or may include an AI module in which components related to the AI process are integrated into one module to perform AI processing in an on-device method.

Hereinafter, an AI process performed in a device environment and/or a cloud environment or a server environment will be described through FIGS. 5 and 6. FIG. 5 illustrates an example in which receiving data or signals may be performed in the electronic device 100, but AI processing to process input data or signals may be performed in a cloud environment. In contrast, FIG. 6 illustrates an example of on-device processing in which the overall operation related to AI processing for input data or signals is performed in the electronic device 100.

Figure 6:
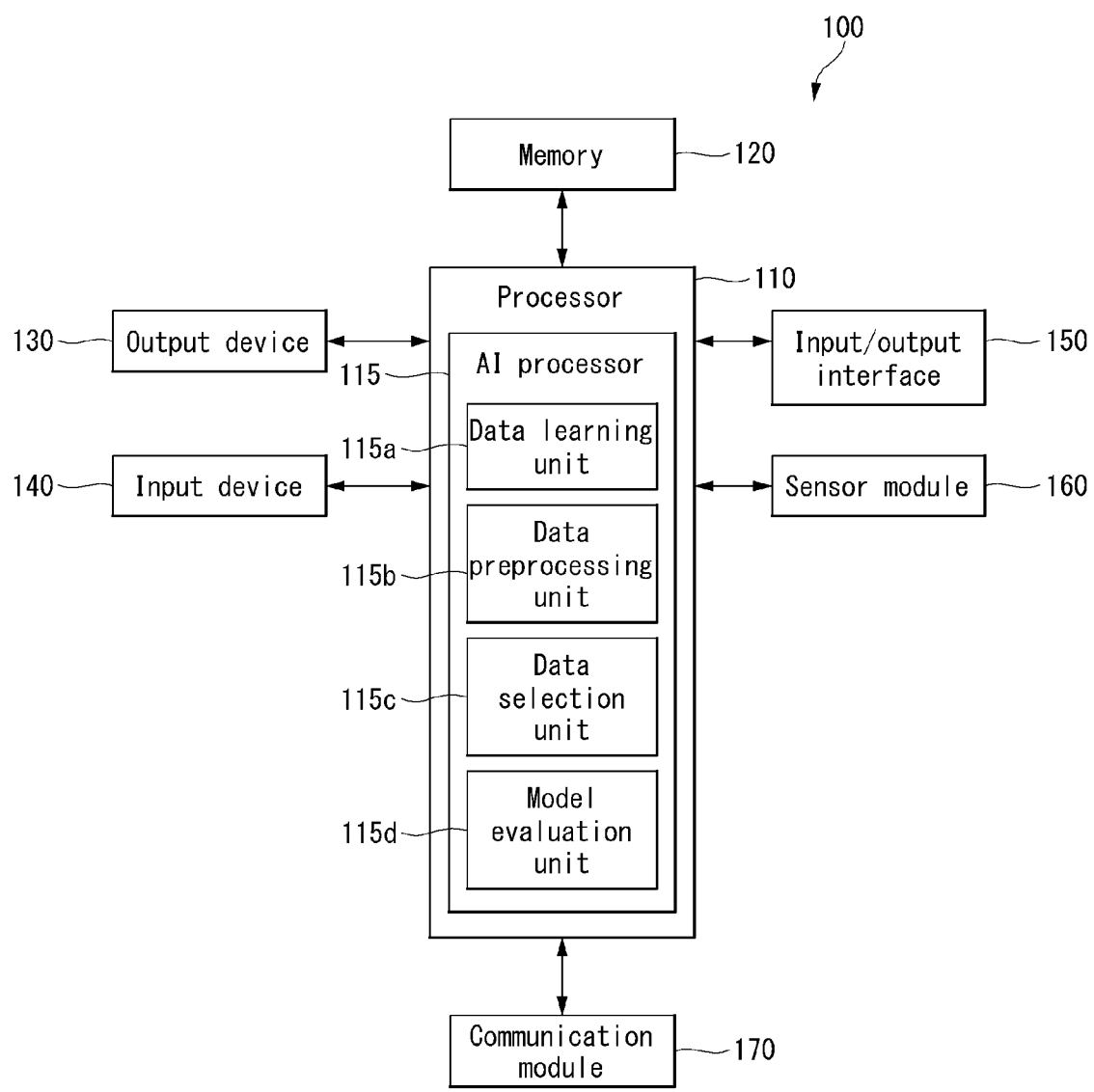
FIG. 6 illustrates a schematic block diagram of an AI device according to another embodiment of the present disclosure.

In FIGS. 5 and 6, the device environment may be referred to as 'client device' or 'AI device', and the cloud environment may be referred to as 'server' or 'AI server'.

FIG. 5 illustrates a schematic block diagram of an AI server according to an embodiment of the present disclosure.

A server 200 may include a processor 210, a memory 220, and a communication module 270.

An AI processor 215 may learn a neural network using a program stored in the memory 220. In particular, the AI processor 215 may learn a neural network for recognizing data related to an operation of an AI device 100. Here, the neural network may be designed to simulate a human brain structure (e.g., a neuron structure of a human neural network) on a computer. The neural network may include an input layer, an output layer, and at least one hidden layer. Each layer may include at least one neuron having a weight, and the neural network may include a synapse connecting neurons and neurons. In the neural network, each neuron may output an input signal input through the synapse as a function value of an activation function for weight and/or bias.

A plurality of network nodes may exchange data according to each connection relationship so that the neurons simulate synaptic activity of neurons that exchange signals through synapses. Here, the neural network may include a deep learning model developed from a neural network model. In the deep learning model, a plurality of network nodes may exchange data according to a convolutional connection relationship while being located in different layers. Examples of neural network models may include various deep learning techniques such as a deep neural network (DNN), a convolutional neural network (CNN), a recurrent neural network, a restricted Boltzmann machine, and a deep belief network, a deep Q-Network, and may be applied in fields such as vision recognition, speech recognition, natural language processing, and voice/signal processing.

Meanwhile, the processor 210 performing the functions as described above may be a general-purpose processor (e.g., a CPU), but may be an AI dedicated processor (e.g., a GPU) for artificial intelligence learning.

The memory 220 may store various programs and data for the operation of the AI device 100 and/or the server 200. The memory 220 may be accessed by the AI processor 215, and may read/write/edit/delete/update data by the AI processor 215. In addition, the memory 220 may store a neural network model (e.g., a deep learning model) generated through a learning algorithm for data classification/recognition according to an embodiment of the present disclosure. Furthermore, the memory 220 may store not only the learning model 221 but also input data, learning data, and learning history, etc.

Meanwhile, the AI processor 215 may include a data learning unit 215a for learning a neural network for data classification/recognition. The data learning unit 215a may learn a criterion for which learning data to use in order to determine data classification/recognition and how to classify and recognize data using the learning data. The data learning unit 215a may learn the deep learning model by acquiring learning data to be used for learning and applying the acquired learning data to the deep learning model.

The data learning unit 215a may be manufactured in the form of at least one hardware chip and mounted on the server 200. For example, the data learning unit 215a may be manufactured in the form of a dedicated hardware chip for artificial intelligence, and may be manufactured as a part of a general-purpose processor (CPU) or a graphics dedicated processor (GPU) and mounted on the server 200. Further, the data learning unit 215a may be implemented as a software module. When implemented as a software module (or a program module including an instruction), the software module may be stored in a computer-readable non-transitory computer readable media. In this case, at least one software module may be provided to an operating system (OS) or may be provided by an application.

The data learning unit 215*a* may learn to have a criterion for determining how a neural network model classifies/recognizes predetermined data using the acquired learning data. In this case, the learning method by the model learning unit may be classified into supervised learning, unsupervised learning, and reinforcement learning. Here, the supervised learning may refer to a method of learning an artificial neural network in a state where a label for learning data is given, and the label may mean a correct answer (or result value) that the artificial neural network infers when the learning data is input to the artificial neural network. The unsupervised learning may mean a method of learning an artificial neural network in a state where a label for learning data is not given. The reinforcement learning may mean a method in which an agent defined in a specific environment learns to select an action or action sequence that maximizes the cumulative reward in each state. In addition, the model learning unit may learn the neural network model using a learning algorithm including an error backpropagation method or a gradient decent method. When the neural network model is learned, the learned neural network model may be referred to as a learning model 221. The learning model 221 may be stored in the memory 220 and used to infer a result of new input data other than the learning data.

On the other hand, in order to improve the analysis results using the learning model 221, or to save resources or time for the generation of the learning model 221, the AI processor 215 may further include a data preprocessing unit 215*b* and/or a data selection unit 215*c*.

The data preprocessing unit 215*b* may preprocess the acquired data so that the acquired data can be used for learning/inference for determining a situation. For example, the data preprocessing unit 215*b* may extract feature information as preprocessing for input data acquired through the input device, and the feature information may be extracted in a format such as a feature vector, a feature point, or a feature map.

The data selection unit 215*c* may select data necessary for learning among learning data or learning data preprocessed in the preprocessing unit. The selected learning data may be provided to the model learning unit. As an example, the data selection unit 215*c* may select only data on an object included in a specific region as learning data by detecting the specific region among images acquired through a camera of the electronic device. In addition, the data selection unit 215*c* may select data necessary for inference among input data acquired through the input device or input data preprocessed by the preprocessing unit.

In addition, the AI processor 215 may further include a model evaluation unit 215*d* to improve the analysis result of the neural network model. When the model evaluation unit 215*d* inputs evaluation data to the neural network model and the analysis result output from the evaluation data does not satisfy a predetermined criterion, the model evaluation unit 215*d* may cause the model learning unit to relearn. In this case, the evaluation data may be predetermined data for evaluating the learning model 221. As an example, among the analysis results of the learned neural network model for evaluation data, when the number or ratio of evaluation data with inaccurate analysis results exceeds a predetermined threshold, the model evaluation unit 215*d* may evaluate that the predetermined criterion is not satisfied.

The communication module 270 may transmit the AI processing result by the AI processor 215 to an external electronic device.

In FIG. 5 above, it has been described that an example in which an AI process is implemented in a cloud environment due to computing operation, storage, and power constraints, but the present disclosure is not limited thereto, and the AI processor 215 may be implemented in a client device. FIG. 6 is an example in which AI processing is implemented in the client device, and is the same as illustrated in FIG. 5 except that the AI processor 215 is included in the client device.

FIG. 6 illustrates a schematic block diagram of an AI device according to another embodiment of the present disclosure.

The function of each configuration shown in FIG. 6 may refer to FIG. 5. However, since the AI processor is included in the client device 100, it may not be necessary to communicate with the server (200 in FIG. 5) in performing processes such as data classification/recognition, and accordingly, immediate or real-time data classification/recognition operation is possible. In addition, since there is no need to transmit the user's personal information to the server (200 in FIG. 5), the data classification/recognition operation for the purpose is possible without external leakage of the personal information.

On the other hand, each of the components shown in FIGS. 5 and 6 represents functional elements that are functionally divided, and it is noted that at least one component may be implemented in a form that is integrated with each other (e.g., an AI module) in an actual physical environment. Also, components not disclosed in addition to the plurality of components illustrated in FIGS. 5 and 6 may be included or omitted.

Figure 7:
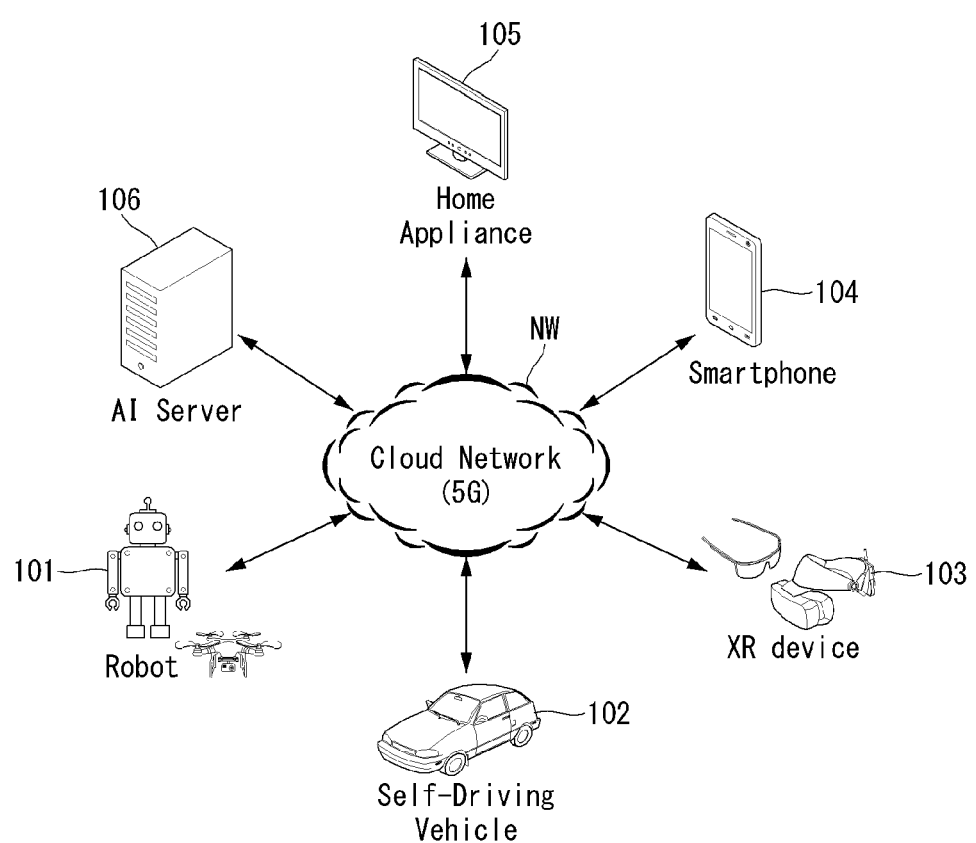
FIG. 7 is a conceptual diagram illustrating an embodiment of an AI device according to an embodiment of the present disclosure.

FIG. 7 is a conceptual diagram illustrating an embodiment of an AI device.

Referring to FIG. 7, in an AI system 1, at least one of an AI server 106, a robot 101, a self-driving vehicle 1002, an XR device 103, a smartphone 104, or a home appliance 105 are connected to a cloud network NW. Here, the robot 101, the self-driving vehicle 1002, the XR device 103, the smartphone 104, or the home appliance 105 applied with the AI technology may be referred to as the AI devices 101 to 105.

The cloud network NW may mean a network that forms a part of a cloud computing infrastructure or exists in the cloud computing infrastructure. Here, the cloud network NW may be configured using the 3G network, the 4G or the Long Term Evolution (LTE) network, or the 5G network.

That is, each of the devices 101 to 106 constituting the AI system 1 may be connected to each other through the cloud network NW. In particular, each of the devices 101 to 106 may communicate with each other through a base station, but may communicate directly with each other without going through the base station.

The AI server 106 may include a server performing AI processing and a server performing operations on big data.

The AI server 106 may be connected to at least one of the robots 101, the self-driving vehicle 1002, the XR device 103, the smartphone 104, or the home appliance 105, which are AI devices constituting the AI system, through the cloud network NW, and may assist at least some of the AI processing of the connected AI devices 101 to 105.

At this time, the AI server 106 may learn the artificial neural network according to the machine learning algorithm on behalf of the AI devices 101 to 105, and directly store the learning model or transmit it to the AI devices 101 to 105.

At this time, the AI server 106 may receive input data from the AI devices 101 to 105, infer a result value for the received input data using the learning model, generate a response or a control command based on the inferred result value and transmit it to the AI devices 101 to 105.

Alternatively, the AI devices 101 to 105 may infer the result value for the input data directly using the learning model, and generate a response or a control command based on the inferred result value.

Hereinafter, the present disclosure will be described with respect to a mobile terminal as an example of the AI device explained with reference to FIGS. 4 to 6. Components and conceptual diagrams of the mobile terminal will be explained first, and then a method for controlling a boombox function of a mobile terminal according to an embodiment of the present disclosure will be described.

Figure 8:
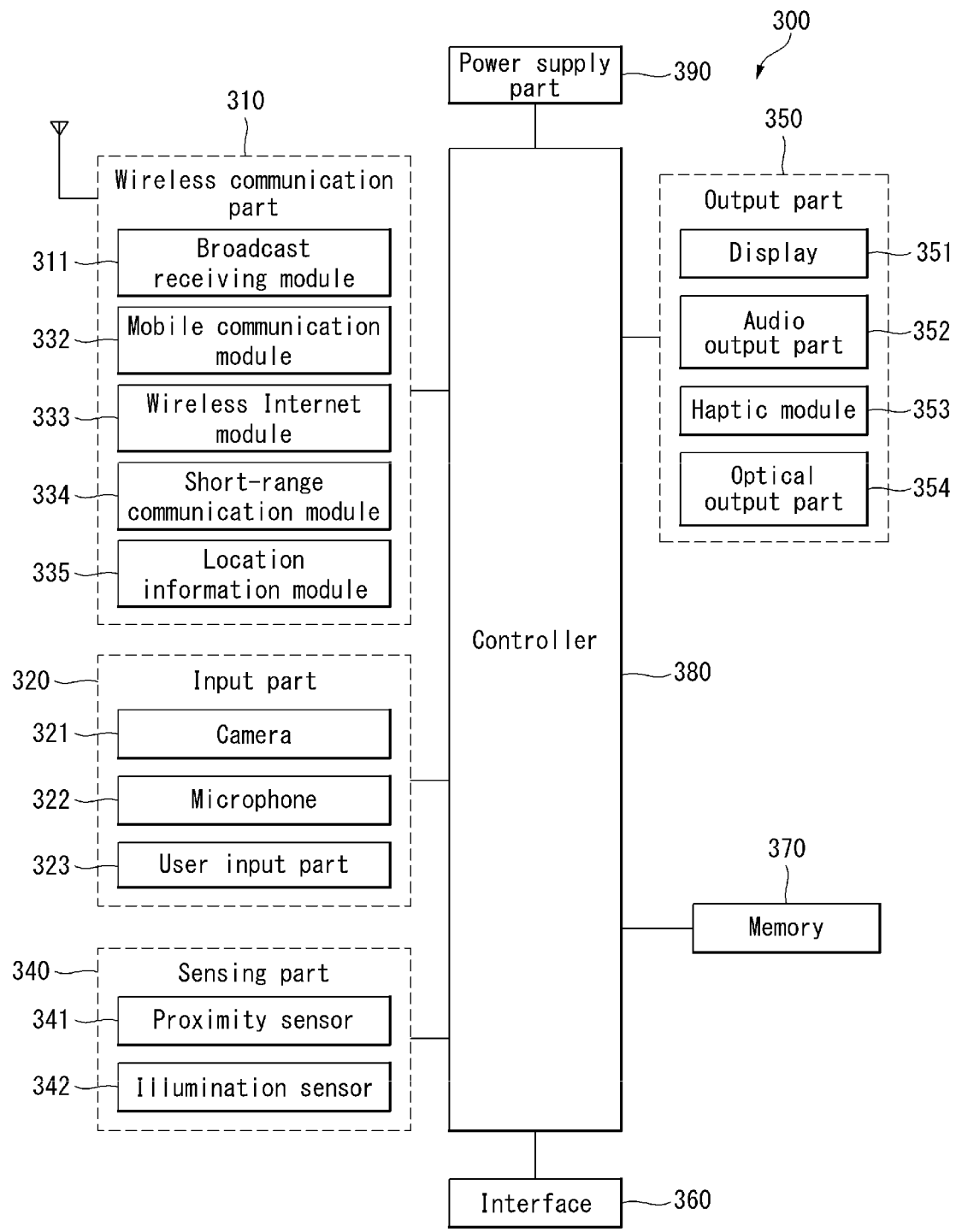
FIG. 8 is a block diagram illustrating a mobile terminal relating to the present disclosure.
Figure 9:
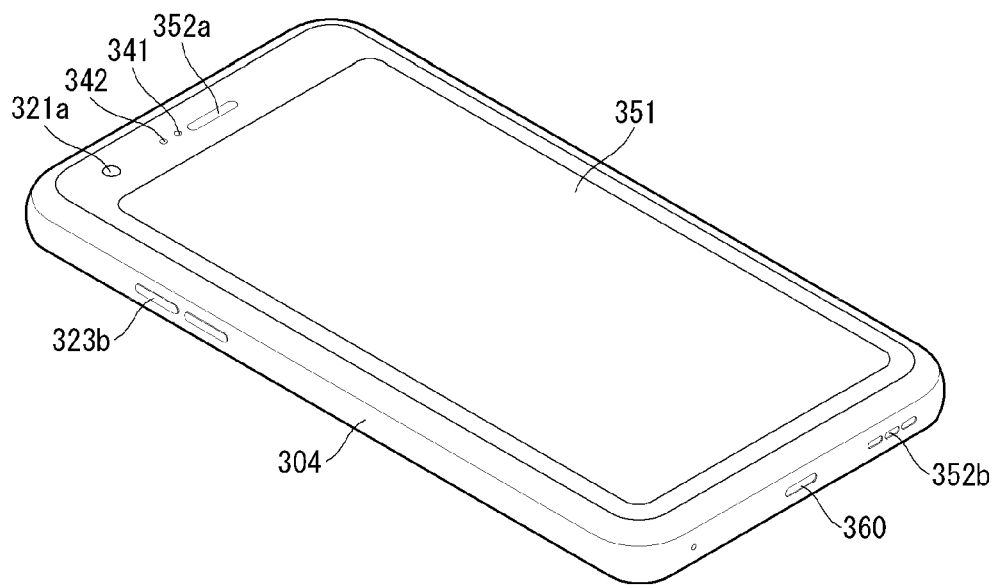
FIGS. 9 and 10 are conceptual diagrams of an example of a mobile terminal according to an embodiment of the present disclosure, as viewed from different directions.
Figure 10:
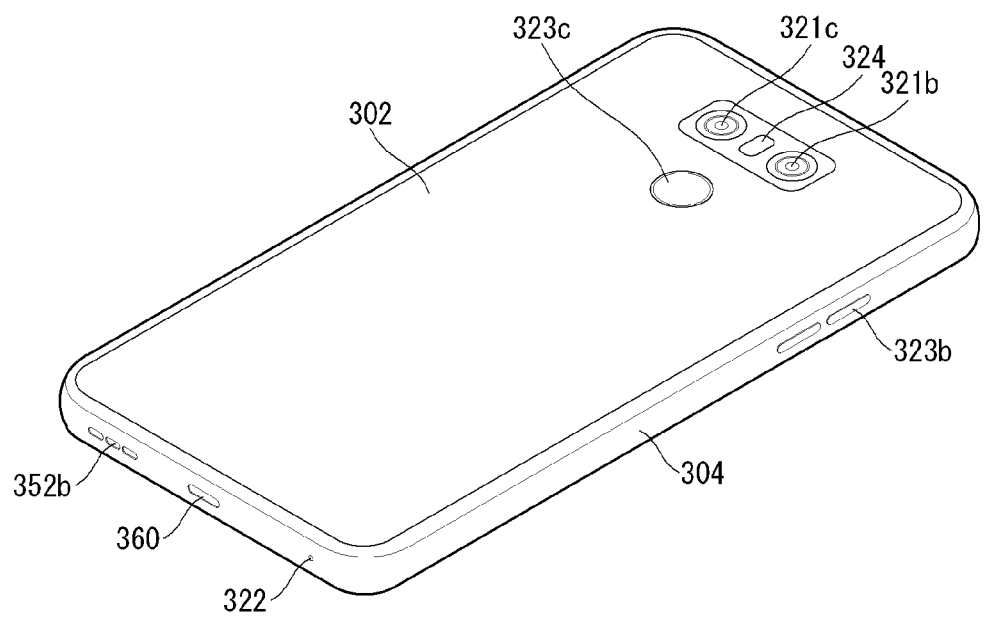

FIG. 8 is a block diagram illustrating a mobile terminal relating to the present disclosure. FIGS. 9 and 10 are conceptual diagrams of an example of a mobile terminal relating to the present disclosure, as viewed from different directions.

The mobile terminal 300 may comprise a wireless communication part 310, an input part 320, a sensing part 340, an output part 350, an interface 360, a memory 370, a controller 380, and a power supply part 390. The components shown in FIG. 8 are not essential for implementing a mobile terminal, and thus the mobile terminal described herein may have more or fewer components than those listed above.

More specifically, the wireless communication part 310, among the aforementioned components, may comprise one or more modules that enable wireless communications between the mobile terminal 300 and a wireless communication system, between the mobile terminal 300 and another mobile terminal 300, or between the mobile terminal 300 and an external server. In addition, the wireless communication part 310 may comprise one or more modules for connecting the mobile terminal 300 to one or more networks.

The wireless communication part 310 may comprise at least one among a broadcast receiving module 311, a mobile communication module 312, a wireless interne module 313, a short-range communication module 314, and a location information module 315.

The input part 320 may comprise a camera 321 or image input part for receiving image signal input, a microphone 322 or audio input part for receiving audio signal input, and a user input part 323 (for example, a touch key, a push key (or mechanical key), etc.) for receiving information from a user. Audio data or image data collected by the input part 320 may be analyzed and processed by the user's control commands.

The sensing part 340 may comprise one or more sensors for sensing at least one among information inside the mobile terminal, information on the surrounding environment of the mobile terminal, and user information. For example, the sensing part 340 may comprise at least one among a proximity sensor 341, an illumination sensor 342, a touch sensor, an acceleration sensor, a magnetic sensor, a G-sensor, a gyroscope sensor, a motion sensor, an RGB sensor, an infrared (IR) sensor, a finger scan sensor, an ultrasonic sensor, an optical sensor (e.g., camera (refer to 321)), a microphone (refer to 322), a battery gauge, an environment sensor (e.g., barometer, hygrometer, thermometer, radiation detection sensor, thermal sensor, gas sensor, etc.), and a chemical sensor (e.g., electronic nose, health care sensor, biometric sensor, etc.). On the other hand, the mobile terminal disclosed herein may use information sensed by at least two of these sensors in combination.

The output part 350 may be configured to produce an output related to visual, auditory, or tactile sense, and may comprise at least one among a display 351, an audio output part 352, a haptic module 353, and optical output part 354.

The display 351 may be implemented as a touchscreen by forming an interlayer structure together with a touch sensor or by being integrated with the touch sensor. Such a touchscreen may function as a user input part 323 providing an input interface between the mobile terminal 300 and the user and, at the same time, provide an output interface between the mobile terminal 300 and the user.

A plurality of audio output parts 352 may be provided, and may comprise a first audio output part 352a located on the front as depicted in FIG. 9 and a second audio output part 352b located on the rear as depicted in FIG. 10. The first audio output part 352a is often used when the user hear voice during a phone call with their ear pressed to it, and the second audio output part 352b may be used to hear voice while keeping it at a distance from their ear. Accordingly, the output of the second audio output part 352b may be higher than that of the first audio output part 352a.

The interface 360 may serve as a path to various types of external devices with which the mobile terminal 300 connects. The interface 360 may include at least one among a wired/wireless headset port, an external charger port, a wired/wireless data port, a memory card port, a port connecting a device equipped with an identification module, an audio input/output (I/O) port, a video input/output (I/O) port, and an earphone port. To handle a connection of an external device to the interface 360, the mobile terminal 300 may perform appropriate control relating to the connected external device.

Additionally, the memory 370 stores data supporting various functions of the mobile terminal 300. The memory 370 may store multiple application programs (or applications) running on the mobile terminal 300 and data and commands for the operation of the mobile terminal 300. At least some of these application programs may be downloaded from an external server via wireless communication. Also, at least some of these application programs may exist on the mobile terminal 300 from the time of shipment to provide basic functions (e.g., making and receiving calls and receiving and sending messages) of the mobile terminal 300. The application programs may be stored in the memory 370 and installed on the mobile terminal 300, and may be run by the controller 380 to perform the operation (or functions) of the mobile terminal.

The controller 380 typically controls the overall operation of the mobile terminal 300, in addition to the operations related to the application programs. The controller 380 may provide or process appropriate information or functions to the user by processing signals, data, information, etc. input or output through the above-described components or by running an application program stored in the memory 370.

In addition, the controller 380 may control at least some of the components illustrated in FIG. 8, in order to run an application program stored in the memory 370. Furthermore, the controller 380 may operate at least two of the components included in the mobile terminal 300 in combination, in order to run the application program.

The power supply part 390 may receive external power or internal power and provide power to the components included in the mobile terminal 300 under control of the controller 380. The power supply part 390 comprises a battery, and the battery may be a built-in battery or replaceable battery.

At least some of the above components may work in cooperation with one another in order to implement the operation, control, or control method of the mobile terminal according to various embodiments to be described below. Moreover, the operation, control, or control method of the mobile terminal may be implemented on the mobile terminal by running at least one application program stored in the memory 370.

Referring now to FIGS. 9 and 10, the disclosed mobile terminal 300 has a bar-type terminal body. However, the present disclosure is not limited to this, but may be applied to various structures, including watch-type phones, clip-type phones, glasses-type phones, and folder-type, flip-type, slider-type, swing-type, and swivel-type phones in which two or more bodies are coupled to move relative to each other. A description of a particular type of mobile terminal, although relevant to a particular type of mobile terminal, is generally applicable to other types of mobile terminals.

Herein, the terminal body can be understood as a concept that refers to the mobile terminal 300 as at least one aggregate.

The mobile terminal 300 comprises a housing (e.g., housing, window, etc.) that forms the outer appearance. The front and rear of the mobile terminal 300 are usually constructed by using a front case and a rear case, and electronic parts are mounted in an internal space between the front case and the rear case. However, the recent trend is that the display 351 takes up much of the front as the display 351 becomes larger in size, and the size of a window 351a protecting the front of the display 351 is enlarged to cover the entire front side of the mobile terminal 300. In this case, the periphery of the rear case 302 may protrude forward and cover the side of the mobile terminal 300.

The front case may be omitted. Instead, a middle frame 305 for reinforcing the rigidity of the mobile terminal 300 while supporting the back of the display 351 may be provided, and the housing of the mobile terminal 300 may be constructed by mounting electronic components on the back of the middle frame 305 and connecting the rear case to the back.

A side case 304 may be separately provided to cover the side of the mobile terminal 300, and the side case 304 may be integrated with the middle frame 305 described above. That is, a portion of the periphery of the middle frame 305 exposed to the outside may be the side case 304. When the side case 304 comprises a metal material, the side case 304 may be used as part of an antenna, and the rear case 302 may be made of a different material from the side case 304. A design employing metal or glass for the rear case 203 may be adopted.

As described above, the housing that forms the outer appearance of the mobile terminal 300 comprises a plurality of cases 302 and 304 and a window 351a, and water may infiltrate through gaps between the cases 302 and 304 and the window 351a. A waterproof tape, a waterproof adhesive, or a waterproof ring 308 made of resin, rubber or elastic material may be used to shield the gaps between the cases 302 and 304 and the window 351a of the mobile terminal 300 to prevent water from infiltrating the inner space in which components are mounted. As the functions of the mobile terminal 300 are diversified, the waterproof function is becoming more desirable because the mobile terminal 300 is used even in a swimming pool or on a rainy day.

The display 351, the first audio output part 352a, the proximity sensor 341, illumination sensor 342, the optical output part 354, the first camera 321a, and a front input part may be placed on the front of the mobile terminal 300, and some of the above components may be omitted or placed elsewhere in order to enlarge the display 351 on the front.

The mobile terminal 300 will be described with an example in which a side input part 323b, the microphone 322, the second audio output part 352b, and the interface 360 are placed on the side of the mobile terminal 300 and a second camera 321b and a rear input part 323c are placed on the rear of the terminal body. The present disclosure is not limited to this configuration, but the side input part 323b, microphone 322, second audio output part 352b, and interface 360 may be placed on the back or front of the mobile terminal 300.

The display 351 displays (outputs) information processed by the mobile terminal 300. For example, the display 351 may display execution screen information of an application program running on the mobile terminal 300 or user interface (UI) and graphic user interface (GUI) information corresponding to the execution screen information.

The optical output part 354 may output light for indicating an event generation. Examples of the event may include message reception, call signal reception, a missed call, an alarm, a schedule notice, email reception, information reception through an application, and the like. Upon sensing the user's acknowledgement of the event, the controller 380 may control the optical output part 354 to stop the light output.

The first camera 321a may process image frames of still pictures or video acquired by the image sensor in a capture mode or a video call mode. The processed image frames may then be displayed on the display 351 or stored in the memory 370.

Input received by the front input part 323a and side input part 323b may be set in various ways. For example, the front input part may receive a command input such as a menu, home key, cancel, and search, and the side input part 323b may receive a command input such as controlling the volume of sound output from the first or second audio output part 352a and 352b and switching the display 351 to touch recognition mode. The rear input part 323c may be implemented in such a form that enables touch input, push input, or a combination of the two.

Meanwhile, the rear input part 323c may be provided on the rear of the terminal body as another example of the user input part 323. The rear input part 323c is manipulated to receive command inputs for controlling the operation of the mobile terminal 300. For example, it may receive command inputs such as power on/off, start, finish, and scroll and command inputs such as controlling the volume of sound output from the first and second audio output parts 352a and 152b and switching the display 351 to touch recognition mode. The rear input part 323c may be implemented in such a manner as to enable touch input, push input, or a combination thereof.

The rear input part 323c may be located to overlap the display 351 on the front in the thickness direction of the terminal body. In one example, the rear input part 323c may be located on the rear upper edge of the terminal body so that the user can easily manipulate the terminal body with an index finger when gripping it in one hand. However, the present disclosure is not necessarily limited thereto, and the position of the rear input part 323c may be changed.

In the case where the rear input part 323a is provided on the rear of the terminal 300's body, a new type of user interface may be implemented using it. Moreover, the above-explained touchscreen or rear input part 323c may replace at least some of the functions of the front input part provided on the front of the terminal body, so that the display 351 may be configured as a larger screen if the front input part is not provided on the front of the terminal body.

Meanwhile, the mobile terminal 300 may comprise a fingerprint recognition sensor for recognizing a user's fingerprint, and the controller 380 may use fingerprint information detected through the fingerprint recognition sensor as a means of authentication. The fingerprint recognition sensor may be embedded in the display unit 351 or the user input part 323.

The microphone 322 is configured to receive the user's voice and other sounds. The microphone 322 may be provided at a plurality of positions and configured to receive stereo audio input.

The interface 360 may serve as a path that allows the mobile terminal 300 to connect with an external device. For example, the interface 360 may be at least one among a connection terminal for connecting with another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 300. The interface unit 360 may be implemented in the form of a socket for accommodating an external card, such as Subscriber Identification Module (SIM), User Identity Module (UIM), or a memory card for information storage.

The second camera 321b may be located on the rear of the terminal body. In this case, the second camera 321b captures images in a direction substantially opposite to the direction in which the first camera 321 captures images.

The second camera 321b may comprise a plurality of lenses arranged along at least one line. Alternatively, the plurality of lenses may be arranged in a matrix configuration. Such a camera may be called an "array camera." If the second camera 321b is configured as an array camera, it may capture images in various ways by using a plurality of lenses and acquire images of better quality.

A flash 324 may be placed adjacent to the second camera 321b. When capturing an object with the second camera 321b, the flash 324 may illuminate the object.

The second audio output part 352b may be added to the terminal body. The second audio output part 352b may implement a stereo function together with the first audio output part 352a, and also may be used to implement a speakerphone mode during a phone call.

At least one antenna for wireless communication may be provided on the terminal body. The antenna may be embedded in the terminal body or formed in the case. For example, an antenna constituting part of the broadcast receiving module 311 (see FIG. 8) may be configured to be pulled out of or pushed into the terminal body. Alternatively, a film-type antenna may be attached to an inner surface of the rear cover 303, or a case comprising a conductive material may be configured to function as an antenna.

A power supply part 390 (see FIG. 8) for supplying power to the mobile terminal 300 is provided on the terminal body. The power supply part 390 may comprise a battery 391 that is embedded in the terminal body or detachably coupled to the outside of the terminal body.

The battery 391 may be configured to receive power via a power source cable connected to the interface 360. Also, the battery 391 may be configured to be wirelessly charged through a wireless charger. Wireless charging may be implemented by magnetic induction or resonance (electromagnetic resonance).

An accessory for protecting the exterior or assisting or extending the functionality of the mobile terminal 300 may be added to the mobile terminal 300. An example of such an accessory may include a cover or pouch that covers or houses at least one side of the mobile terminal 300. The cover or pouch may be configured to interface with the display 351 and extend the functionality of the mobile terminal 300. Another example of the accessory may include a touch pen for assisting or extending touch input on the touchscreen.

Hereinafter, embodiments associated with a control method that can be implemented in a mobile terminal configured as above will be described with reference to the accompanying drawings. It should be understood by those skilled in the art that the present disclosure can be embodied in other specific forms without departing from the concept and characteristics thereof.

Figure 11:
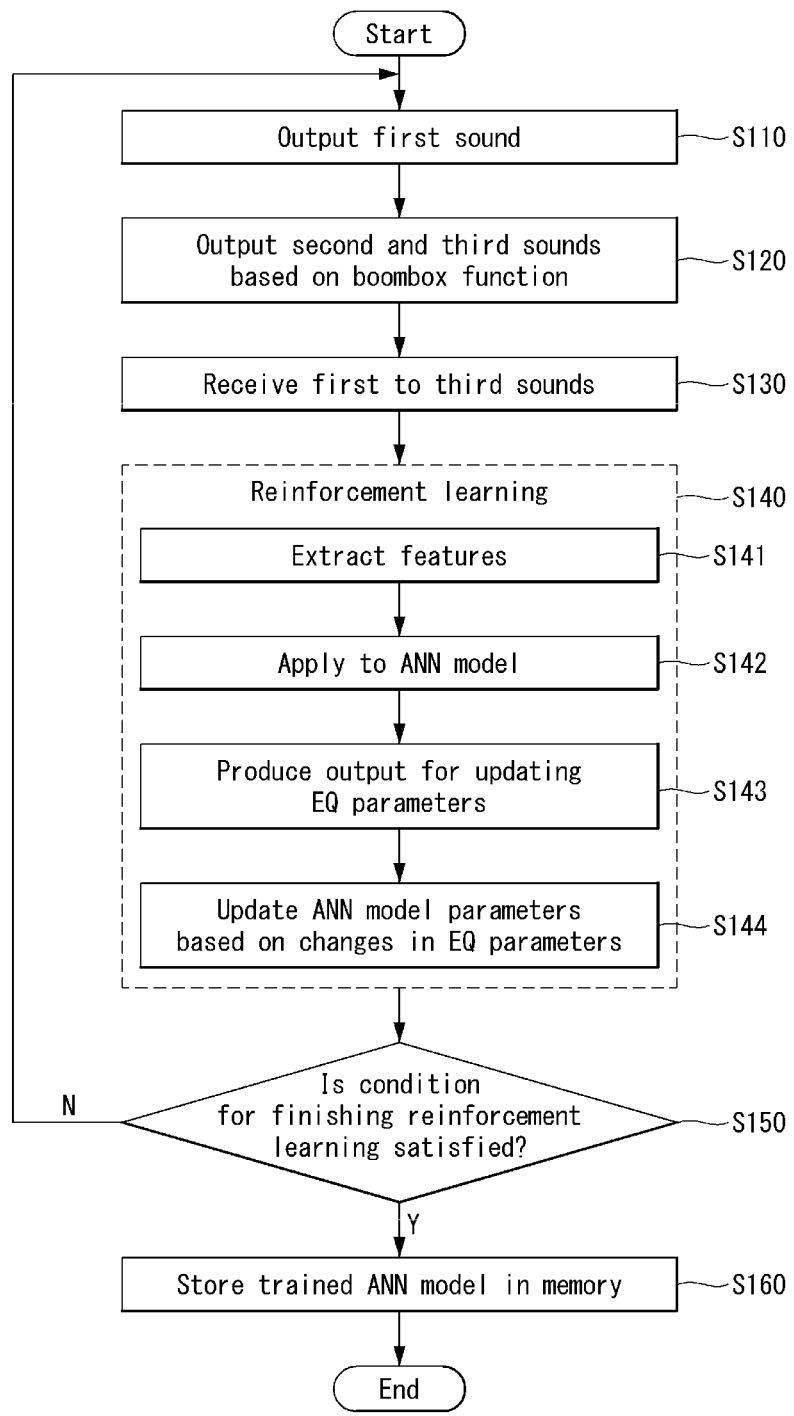
FIG. 11 is a sequence diagram of a method of creating a learning model according to an embodiment of the present disclosure.

FIG. 11 is a sequence diagram of a method of creating a learning model according to an embodiment of the present disclosure.

Referring to FIG. 11, a mobile terminal 300 may output a first sound through a speaker 152 (S110).

The mobile terminal 300 may output second and third sounds based on a boombox function (S120). The boombox function refers to a method of generating vibration on various mediums using the sound output through the speaker 152 to generate a new sound by the generated vibration. The mobile terminal 300 has spatial limitations because a variety of electronic parts may have to fit into a small space, and also has limitations in terms of the quality of sound output because of the spatial limitations. Using the boombox function, the mobile terminal 300 may output a new sound with a higher sound pressure level than the sound output through the speaker 152 at low frequencies by the vibration of the medium. Here, the medium may comprise a case 102 forming the exterior of the mobile terminal 300 and/or a resting surface I that comes in contact with the case 102 of the mobile terminal 300. The resting surface I may be made of wood, metal, or cloth, and the properties of sound generated by vibration may change depending on the type of the resting surface I.

The mobile terminal 300 according to an embodiment of the present disclosure may output a second sound from the case 102 which is vibrated by the first sound output through the speaker 152. The first sound may be used interchangeably with a first sub-sound, and the second sound may be used interchangeably with a second sub-sound.

Moreover, the mobile terminal 300 according to an embodiment of the present disclosure may output a third sound generated by the vibration of the second sub-sound while the case 102 is in contact with the resting surface I. The third sound may be used interchangeably with a third sub-sound. A more detailed description of the boombox function will be described with reference to FIG. 12.

The mobile terminal 300 may receive the first to third sounds through a microphone (S130).

The mobile terminal 300 may produce an output for updating information related to audio output with second information related to audio output by extracting feature values or feature vectors from the first to third sounds and first information and applying the extracted feature values or feature vectors to an artificial neural network (ANN)-based learning model (S141 and S142). The first and second information may comprise equalizer parameter values. The equalizer parameters may comprise at least one parameter by which the speaker 152 outputs sound, and may adjust decibels for all frequencies in a plurality of set frequency bands. Moreover, the features of sound that can be extracted from the sound may comprise at least one of the pitch, duration, and frequency of the sound.

The mobile terminal 300 may compare the second information generated based on the output of the learning model and the first information and update at least one parameter constituting the artificial neural network-based learning model based on the differences (S143 and S144). More specifically, the artificial neural network-based learning model may comprise at least one node, and the mobile terminal 300 may generate a reward for reinforcement learning through a processor, based on the differences between the first information and the second information. The mobile terminal 300 may change or optimize the weight or bias for the artificial neural network-based learning model by using the generated reward.

If the learning model satisfies a condition for finishing reinforcement learning, the learning model whose learning is finished may be stored in a memory (S150: YES, S160). Here, the learning model may be stored in a memory or in a memory of an AI system capable of communication via a network.

Meanwhile, if the condition for finishing reinforcement learning is not satisfied, the mobile terminal 300 repeatedly updates the parameters of the learning model until the finishing condition is satisfied (S150: NO). The finishing condition may be provided as the number of repetitions of the updating of the parameters of the learning model and/or as the amount of the reward generated in the parameter updating process.

Figure 12:
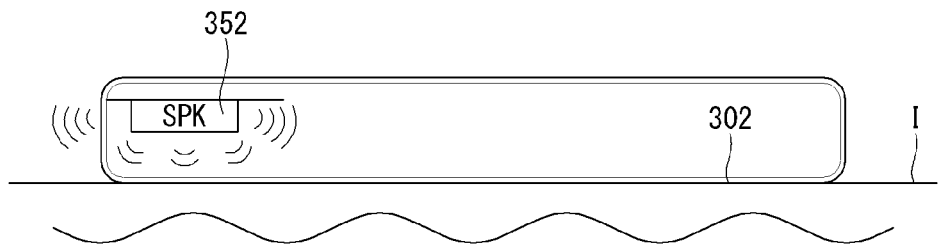
FIG. 12 is a view illustrating first and second indirect vibrations of a mobile terminal according to the present disclosure.

FIG. 12 is a view illustrating first and second indirect vibrations of a mobile terminal according to the present disclosure.

Referring to FIG. 12, the vibration of a first sound is transmitted to the rear case 102 or window 151 of the mobile terminal 300 because the speaker of the present disclosure uses part of the inside as a resonant space. The vibration of the first sound transmitted to the rear case 102 and the window 151 is referred to as the first indirect vibration, and the vibrating rear case 102 and window 151 may function as an auxiliary speaker that outputs a second sound.

Since the first indirect vibration causes the vibration of the case 102, which is thick compared with the diaphragm of the speaker, the second sound output by the first indirect vibration has a lower frequency than the first sound. The lower stiffness of a vibrating body, the higher density, and the larger surface area make the resonant lower. Also, the lower the stiffness, the smaller the force needed to obtain a high output. The window 151 on the front has high stiffness since it is supported by the display and middle frame on the back, and therefore the effect of the first indirect vibration on the window 151 is weak compared to that on the rear case 102.

For the first indirect vibration of the present disclosure, the rear case 102 may have a flat structure and made of a glass material with low stiffness. However, the case 102 is not limited to this material but may be made of a metal or polymer material.

The first indirect vibration allows for generating a second sound having a lower frequency than the first sound, thereby reinforcing low-frequency from a micro speaker mounted in the mobile terminal 300. The mobile terminal 300 may activate the boombox function, whose sound quality at low frequencies is improved by the first indirect vibration, to increase low-frequency output, or may deactivate the boom box function to decrease low-frequency output and therefore minimize the first indirect vibration.

Figure 13:
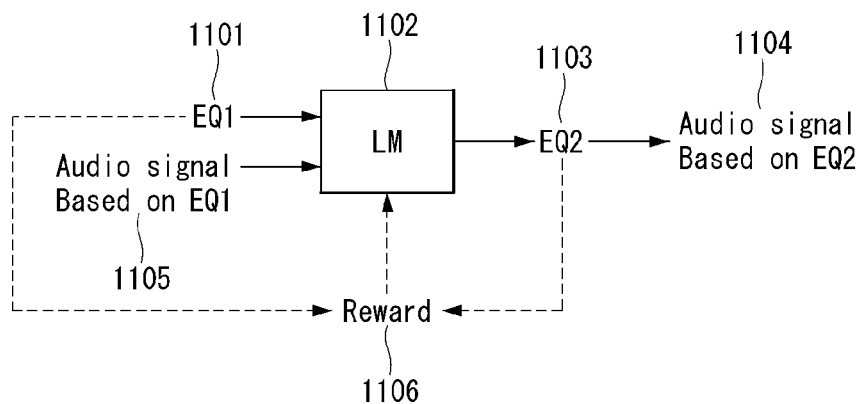
FIG. 13 is a view depicting a learning model applied to an embodiment of the present disclosure.
Figure 13:
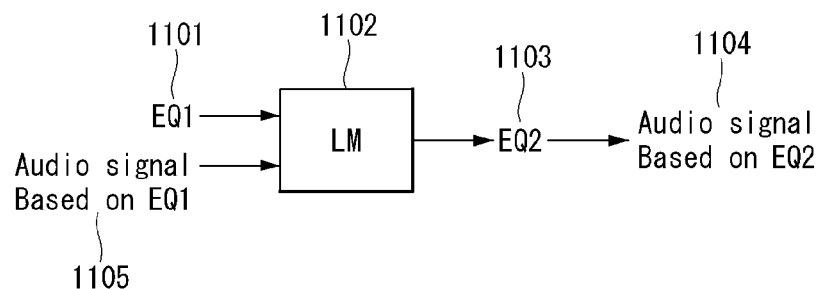

FIG. 13 is a view depicting a learning model applied to an embodiment of the present disclosure.

Referring to FIG. 13, an input into an artificial neural network-based learning model 1102 may comprise first information 1101 related to audio output and a first sound 1105 based on the first information 1101 related to audio output. Here, the first information 1101 related to audio output is equalizing information, which may comprise at least one equalizer adjustment parameter. The first sound 1105 is a sound output through a speaker of the mobile terminal 300, which comprises acoustic features corresponding to the first information 1101. The first sound 1105 may comprise a first sub-sound output through the speaker, a second sub-sound output from a case that is vibrated by the first sub-sound, and a third sub-sound output from a resting surface that comes in contact with the vibrating case.

An output from the artificial neural network-based learning model 1102 may comprise second information 1103 related to audio output. Like the first information 1101, the second information 1103 may comprise at least one equalizer adjustment parameter. Meanwhile, the second information 1103 may have a different value than the first information 1101. For example, the first sound 1105 comprises second and third sub-sounds, as well as the first sub-sound output from the speaker based on the first information 1101, and therefore the equalizer parameters determined based on the first sound 1105 comprising the first to third sub-sounds may be different from the equalizer parameters corresponding to the preset first information 1101.

The artificial neural network-based learning model 1102 according to an embodiment of the present disclosure may adjust the weight or bias for the learning model 1102 by comparing the input first information 1101 and the second information 1103 determined based on the output. The adjustment of the parameters of the learning model 1102 according to a preset learning model may be defined as a kind of reinforcement learning. The mobile terminal 300 may compare the equalizer parameters corresponding to the first information 1101 for outputting the first sub-sound and the equalizer parameters corresponding to the second information 1103 and provide parameters that reflect the differences. A compensation value for adjusting the parameters of the learning model 1102 may be referred to as a "reward 1106." That is, the learning model 1102 may calculate the reward 1106 based on the differences between the first and second information 1101 and 1103 and update at least one parameter constituting the learning model 1102 based on the calculated reward 1106.

The mobile terminal 300 may update the parameters of the learning model 1102 through multiple reinforcement learning strokes and perform a preset number of learning strokes or more, or may perform a learning stroke until the calculated reward 1106 reaches a set reference value or higher and finish the reinforcement learning. Once the learning is finished, the artificial neural network-based learning model 1102 may be stored in the memory 370 of the mobile terminal 300 or in the memory 370 of a server capable of communicating with the mobile terminal 370.

The mobile terminal 300 may infer information related to audio output in order to output optimal sound by using a trained learning model 1102. More specifically, the second information 1103 may be different from the first information 1101, and, as described above, the second information 1103 is determined based on the first information 1101 and the first sub-sound output based on the first information 1101.

When the first sub-sound is output through the speaker based on the first information 1101, the mobile terminal 300 may receive the first sound 1105 which is generated differently depending on the medium. The mobile terminal 300 may infer the second information 1103 by using the received first sound 1105 and first information 1101 as input and control the output of a first' sub-sound based on the inferred second information 1103. The output first' sub-sound allows for outputting second' and third' sub-sounds based on the boombox function.

That is, the mobile terminal 300 according to an embodiment of the present disclosure may perform AI processing to infer and/or generate the second information 1103 for outputting the sound the user intends to produce, regardless of the vibrating medium, because the first sound 1105 based on the first information 1101 which reflects the user's intention may be output as an unintended sound according to the boom box function.

Figure 14:
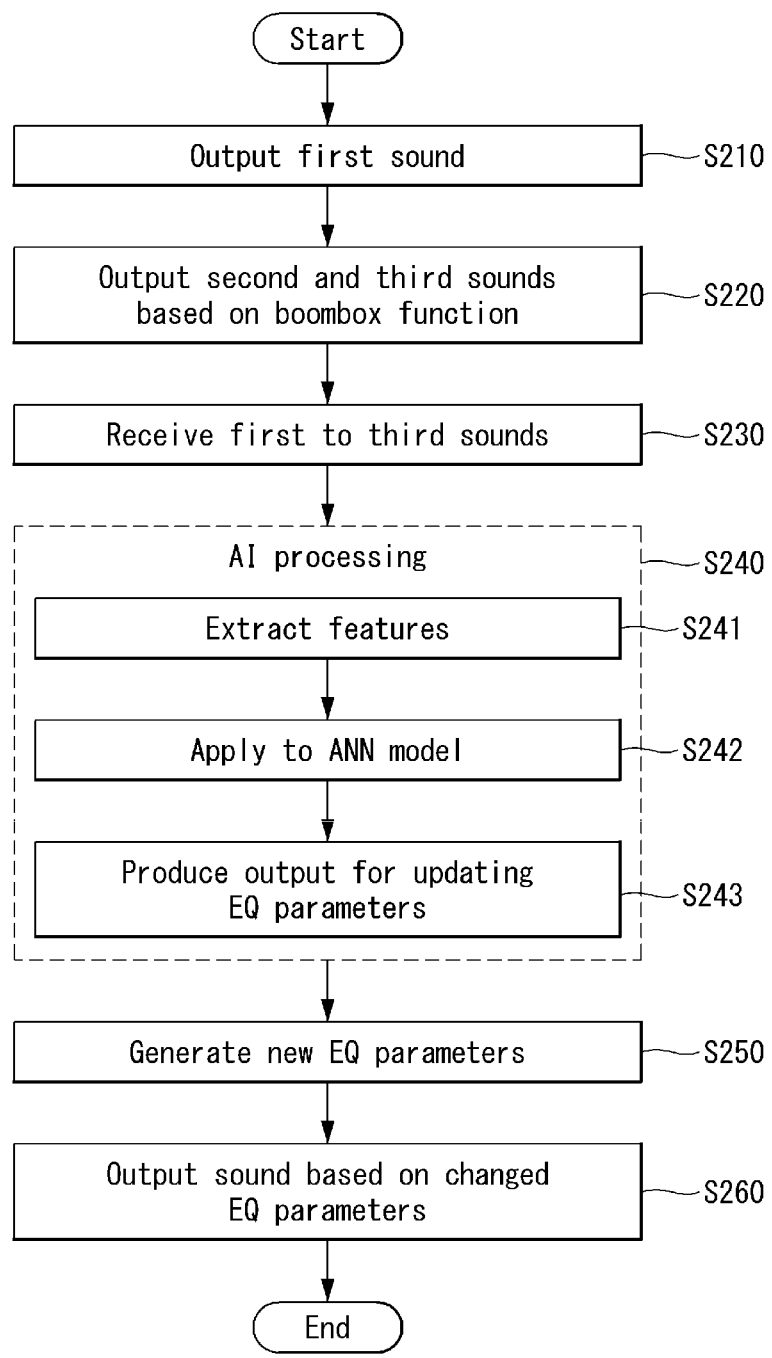
FIG. 14 is a sequence diagram of a method for controlling an equalizer according to an embodiment of the present disclosure.

FIG. 14 is a sequence diagram of a method for controlling an equalizer according to an embodiment of the present disclosure.

Referring to FIG. 14, the mobile terminal 300 may output a first sound through a speaker (S210).

The mobile terminal 300 may output second and third sounds based on a boombox function (S220).

The mobile terminal 300 may receive the first to third sounds through a microphone 322 (S230).

The mobile terminal 300 may produce an output for updating information related to audio output with second information related to audio output by extracting feature values or feature vectors from the first to third sounds and first information related to audio output, which is the basis of the first sound, and applying the extracted feature values or feature vectors to an artificial neural network-based learning model 1102 (S241, S242, and S243). The information related to audio output may comprise equalizing parameters for outputting a sound source received from the mobile terminal 300 or another terminal capable of communicating with the mobile terminal 300.

The mobile terminal 300 may generate second information based on the produced output (S250).

The mobile terminal 300 may output a sound whose volume or frequency is adjusted, based on the second information (S260). This output second combined sound may comprise first' to third' sub-sounds based on the boombox function. The second combined sound may have a different volume and/or frequency than the first sound. Also, a combination of the first' to third' sub-sounds may show the same or similar features to the sound expected to be output based on the first information from an independent boombox speaker which is available as a single unit.

Figure 15:
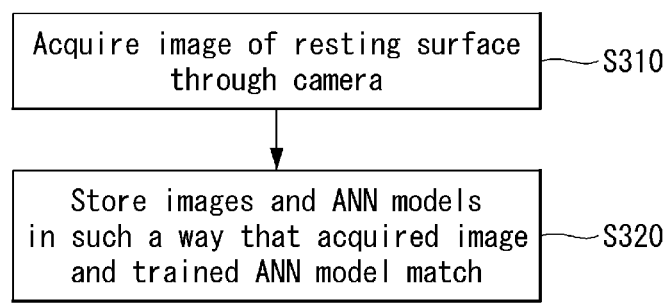
FIG. 15 is a sequence diagram of a method of storing a learning model according to an embodiment of the present disclosure.

FIG. 15 is a sequence diagram of a method of storing a learning model according to an embodiment of the present disclosure.

As described above with reference to FIG. 14, the mobile terminal 300 may receive first to third sub-sounds through a speaker and control the output of the speaker such that a combination of the received first to third sub-sounds corresponds to the output the user intends to produce. That is, the mobile terminal 300 according to an embodiment of the present disclosure may control the output of the speaker such that an output sound generated by the boombox function matches set equalizer parameter values regardless of the material of the resting surface. Meanwhile, the mobile terminal 300 according to an embodiment is problematic in that it has to perform AI processing for a certain amount of time in order to produce an optimal output, which is time- and/or resource-consuming.

A method for controlling an equalizer based on images according to an embodiment of the present disclosure may control the output of the speaker in conjunction with an image acquisition function using a camera, in order to minimize processing tasks for adjusting parameters in response to receipt of output sound.

Referring to FIG. 15, the mobile terminal 300 may acquire an image of the resting surface through a camera (S310). The image may be acquired by user manipulation, or may be automatically acquired in response to a change in the distance between the mobile terminal 300 and the resting surface.

In an example, the mobile terminal 300 may acquire an image of the resting surface in response to the user's touch input on the touchscreen or a pressure input on an input button provided on the case of the mobile terminal 300.

In another example, after outputting sound using the boombox function and updating the learning model parameters based on reinforcement learning, the mobile terminal 300 may capture an image of the resting surface, which is the basis of the updated learning model parameters, in response to a change in the position of the mobile terminal 300. More specifically, once an environment in which the mobile terminal 300 outputs optimal sound is checked through an image, the learning model parameters may be updated faster when sound is output later in the same environment. However, the user may need to perform a repetitive and cumbersome manipulation task to capture a different medium each time when they play a sound source and use the boombox function. Accordingly, if the mobile terminal 300 according to an embodiment of the present disclosure is separated a reference distance or farther from the resting surface after finishing the reinforcement learning of the learning model, the mobile terminal 300 may acquire an image of the resting surface through a camera in response to this change in position.

The mobile terminal 300 may store images and learning models in such a way that a trained learning model and the acquired image match (S320). Specifically, the mobile terminal 300 may store the acquired image with a tag indicating a first learning model attached to it so that the image matches the learning model stored after the steps S110 to S160 of FIG. 11. In an example, a first image may be assigned a tag indicating the first learning model, and a second image may be assigned a tag indicating a second learning model. In this manner, a plurality of images may be assigned their corresponding learning model tags, respectively.

In another example, the mobile terminal 300 may generate medium information of the resting surface included in a received image by analyzing the image. The medium information may be generated based on feature points that can be extracted from the resting surface included in the image. More specifically, the mobile terminal 300 may classify the type of the medium of the resting surface by using the feature points extracted from the image and generate medium information based on the classification result. The mobile terminal 300 may tag the generated medium information to the trained learning model.

Based on an image assigned with a tag indicating a learning model, the mobile terminal 300 may receive the learning model matching the sensed image or the parameter values of the learning model from a memory or a server capable of communication.

Figure 16:
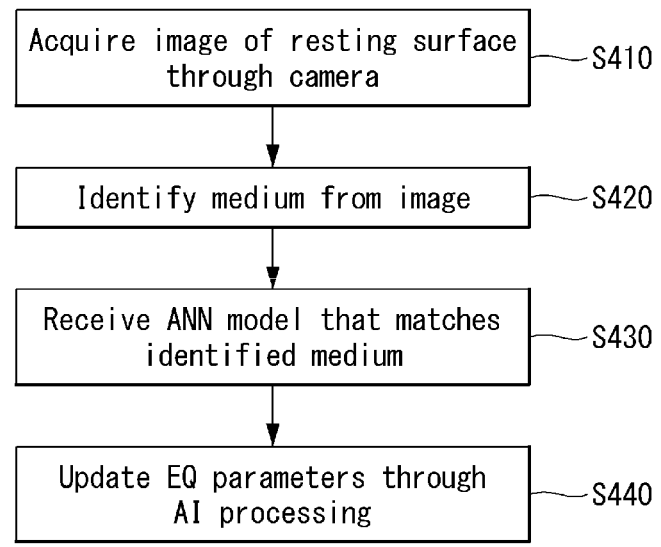
FIG. 16 is a sequence diagram of a method for controlling an equalizer based on images according to an embodiment of the present disclosure.

FIG. 16 is a sequence diagram of a method for controlling an equalizer based on images according to an embodiment of the present disclosure. The mobile terminal may control equalizer parameters based on images, as described with reference to FIG. 15. A detailed description of this will be given below.

Referring to FIG. 16, the mobile terminal 300 may acquire an image of the resting surface through a camera (S410). The mobile terminal 300 according to an embodiment of the present disclosure may acquire an image through a camera in response to the user's input. The mobile terminal 300 according to another embodiment of the present disclosure may acquire an image of the resting surface through a camera when the distance between the mobile terminal 300 and the resting surface becomes close to a set reference value or less. The distance between the mobile terminal 300 and the resting surface may be sensed by a sensor provided in the mobile terminal 300. The sensor includes a TOF sensor, an image sensor, or a gyrosensor, and at least one sensor may be associated with a distance sensing process to implement a distance sensing function.

The mobile terminal 300 may identify a medium from the image (S420). The mobile terminal 300 may classify the medium of the resting surface included in the image by using an image classification model stored in the mobile terminal 300 or in a server capable of communicating with the mobile terminal 300. More specifically, the mobile terminal 300 may extract feature values or feature vectors from the image and produce an output for classifying the medium from the extracted features. In this case, the image classification model may be, but not limited to, a convolutional neural network (CNN)-based classification model.

Once the medium of the resting surface is identified, the mobile terminal 30 may receive a neural network-based learning model that matches the identified medium or the weight or bias for a trained learning model from a memory or a server capable of communication (S430).

The mobile terminal 300 may update the equalizer parameters suitable for the identified medium by using the received learning model or the received weight or bias for a trained learning model (S440).

Figure 17:
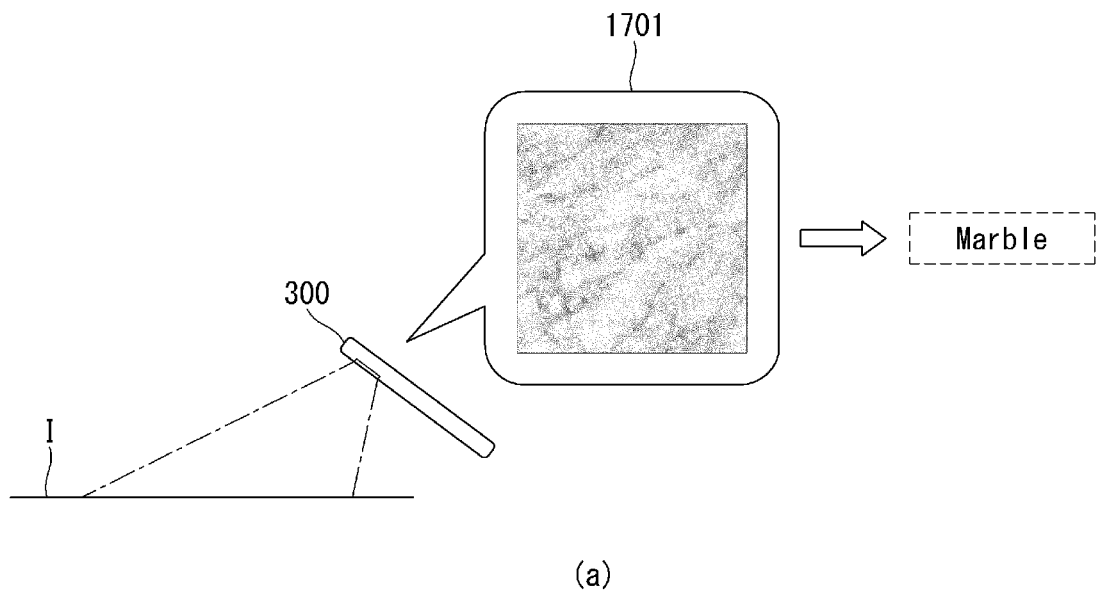
FIG. 17, including parts (a) and (b), and FIG. 18 depict an example implementation of a method for controlling an equalizer based on images according to an embodiment of the present disclosure.
Figure 17:
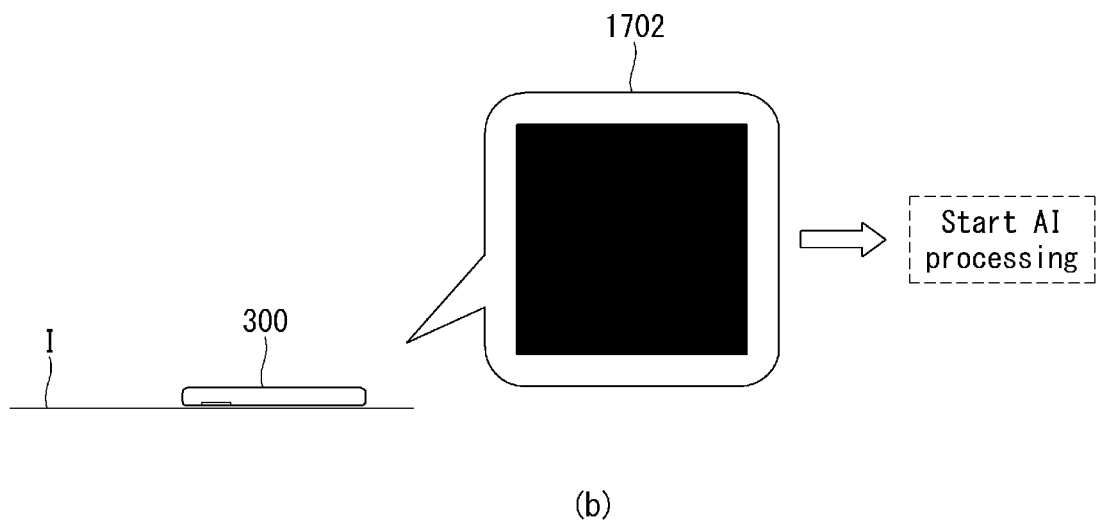
Figure 18:
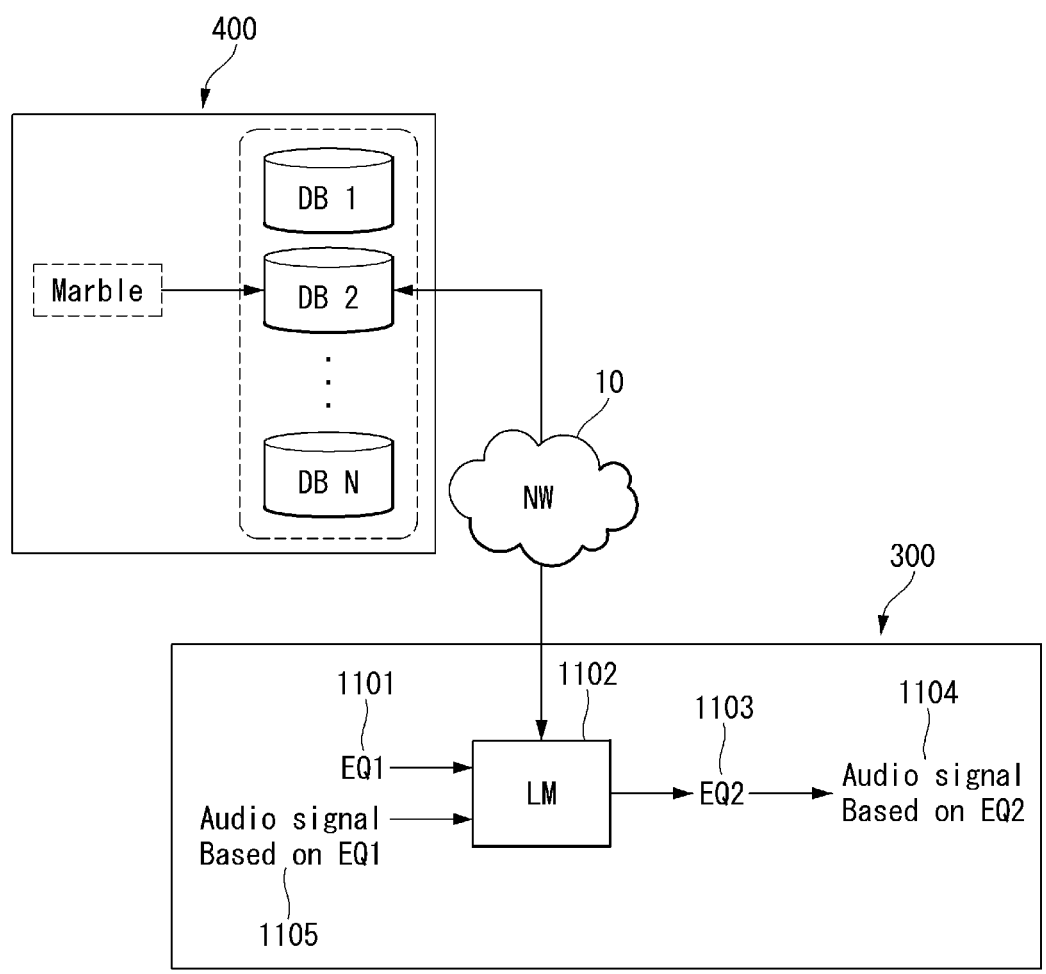

FIGS. 17 and 18 depict an example of implementation of a method for controlling an equalizer based on images according to an embodiment of the present disclosure.

Referring to FIG. 17, the mobile terminal 300 may identify the medium of the resting surface I through a camera 321, receive a learning model matching the identified medium from a memory or a server capable of communication, and perform AI processing.

More specifically, the mobile terminal 300 may determine whether to turn on or off the camera 321 based on the distance between the resting surface I and the mobile terminal 300. When the distance between the mobile terminal 300 and the resting surface becomes close to a set reference value or less, the mobile terminal 300 may capture an image of the resting surface I with which the case is expected to come into contact, through the camera 321. The set reference value may be determined based on the distance between the mobile terminal 300 and the resting surface I and/or the direction of the camera 321. In an example, if the set reference value is too low, the amount of light received through the camera 321 is excessively small, making it difficult to accurately infer the medium. On the other hand, if the reference value is too high, the camera 321 may be turned on unnecessarily when the mobile terminal 300 is expected to be placed on the resting surface I. Thus, the mobile terminal 300 may control the turn-on or turn-off of the camera 321 by analyzing the user's behavioral pattern and/or behavioral intent of placing the mobile terminal 300 on the resting surface I.

The controlling of the turn-on of the camera 321 according to an embodiment of the present disclosure may be performed based on at least one among the brightness of the medium identified through the camera 321, the distance between the mobile terminal 300 and the resting surface I, and the direction of the camera 321.

The brightness of the medium identified through an image 1701 may become gradually darker as the distance between the mobile terminal 300 and the resting surface I becomes smaller. The amount or degree of change in the brightness of the mobile terminal 300 exceeds a set threshold, the mobile terminal 300 is expected to be placed on the resting surface I and an image of the resting surface I may be acquired through the camera 321. Moreover, the distance between the mobile terminal 300 and the resting surface I may be measured by using a sensor placed on the rear of the mobile terminal 300, and, when this distance becomes equal to or less than the set threshold, the image 1701 may be acquired through the camera 321. In addition, the direction of the camera 321 may be determined by using the sensor placed on the rear of the mobile terminal 300, which may be taken into account when measuring the distance from the mobile terminal 300.

The mobile terminal 300 according to various embodiments of the present disclosure may control the capturing operation of the camera 321 based on at least one among the brightness of the medium, the distance between the mobile terminal 300 and the resting surface I, and the direction of the camera 321, as described above, and may take two or more determinants into account depending on the performance of the processor.

Referring to (a) of FIG. 17, when the distance between the mobile terminal 300 and the resting surface I becomes close to a given distance or smaller, the mobile terminal 300 starts capturing the resting surface I through the camera 321. In this case, the image 1701 of the resting surface I may be processed by the processor in the mobile terminal 300 or transmitted to a server capable of communicating with the mobile terminal 300. The mobile terminal 300 may generate information about the type of the medium constituting the resting surface I, based on the acquired image.

Referring to (b) of FIG. 17, an image 1702 acquired through the camera 321 while the mobile terminal 300 is placed on the resting surface I may be an image that is low in brightness or black in color. The mobile terminal 300 may determine the starting point of AI processing by which the learning model parameters are updated based on the brightness of the acquired mage 1703 or new equalizer parameters are generated by using a learning model. The mobile terminal 300 may start the AI processing operation from the determined starting point. For example, the brightness of the image 1702 acquired through the camera 321 located on one surface adjacent to the resting surface I may decrease as the mobile terminal 300 gets gradually closer to the resting surface I. When the decreasing brightness of the image 1702 becomes equal to or less than a set threshold, the mobile terminal 300 may start the AI processing operation.

Referring to FIG. 18, the memory of the server 400 may store neural network model parameters corresponding to a plurality of mediums. Upon receiving medium information from the mobile terminal 300, the server 400 may transmit the parameters of a neural network model matching the medium identified based on the received medium information. Meanwhile, the mobile terminal 300 and the server 400 may send and receive information or data via 5G communication.

To this end, an initial access and/or random access process may be performed on a 5G network 10. More specifically, the mobile terminal 300 may send and receive information or data by linking AI operation to eMBB, URLLC, and mMTC.

Once the medium of the resting surface is identified, the mobile terminal 300 according to an embodiment of the present disclosure may receive the parameters of a neural network matching the identified medium. The parameters of the neural network comprise at least one node constituting the neural network and the weight and/or bias defining the relationship between the at least one node. The mobile terminal 300 may adjust one or two or more weights and/or biases set for the neural network-based learning model 1102 stored in the memory of the mobile terminal 300, based on the received parameters of the neural network. In this manner, the mobile terminal 300 may output optimal sound by using parameters for a sensed or identified medium.

Meanwhile, the method for controlling an equalizer according to an embodiment of the present disclosure is not limited to the process of receiving the parameters of a neural network through the server 400 which communicates via the network 10, but may store neural network parameters corresponding to a plurality of mediums in the memory of the mobile terminal 300. Moreover, in the method for controlling an equalizer according to another embodiment of the present disclosure, optimal sound may be output by a method or algorithm in which the server 400 communicating via the network 10 performs AI processing using the learning model 1102 and the mobile terminal 300 receives an AI-processed response.

Figure 19:
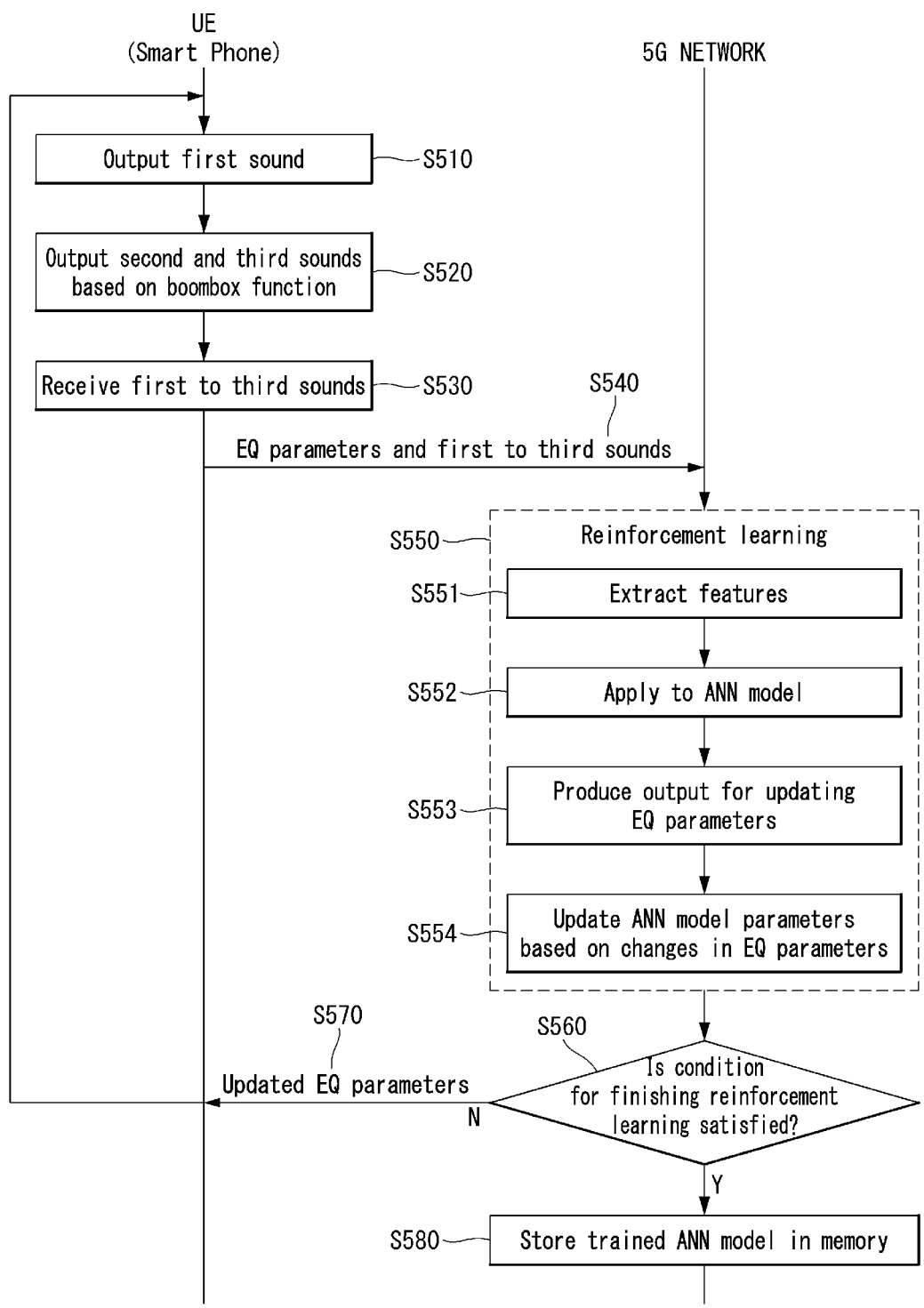
FIG. 19 is a sequence diagram of a method of creating a learning model according to another embodiment of the present disclosure.

FIG. 19 is a sequence diagram of a method for controlling an equalizer according to another embodiment of the present disclosure.

Referring to FIG. 19, the mobile terminal 300 may communicate with other terminals via a network. It is assumed that the network as used herein refers to, but is not limited to, a 5G network. For the transmission and reception of information or data to and from the mobile terminal 300, an initial access and/or random access process may be performed on the network.

More specifically, the mobile terminal 300 may control the transceiver to transmit equalizer parameters and sounds received through the microphone 322. Moreover, the mobile terminal 300 may control the transceiver to receive an AI-processed response from the network.

Meanwhile, the mobile terminal 300 may perform an initial access process with the network, in order to transmit the equalizer parameters and the sounds received through the microphone 322 to the network. The mobile terminal 300 may perform an initial access procedure with a 5G network based on SSB (synchronization signal block).

In addition, the processor may receive, from the 5G network, DCI (downlink control information) which is used to schedule the transmission of the equalizer parameters and the sounds received through the microphone 322 to the 5G network.

The mobile terminal 300 may transmit the equalizer parameters and the sounds received through the microphone 322 to the 5G network. The equalizer parameters and the sounds received through the microphone 322 are transmitted to the 5G network via PUSCH, and the SSB and a DM-RS of the PUSCH may be quasi-co located (QCL) for a QCL type D.

Referring to FIG. 19, the mobile terminal 300 may output a first sound through a speaker 352 (S510).

The mobile terminal 300 may output second and third sounds based on the boombox function (S520). The mobile terminal 300 according to an embodiment of the present disclosure may output a second sound from a case that is vibrated by the first sound output through the speaker 352. The first sound may be used interchangeably with a first sub-sound, and the second sound may be used interchangeably with a second sub-sound.

Moreover, the mobile terminal 300 according to an embodiment of the present disclosure may output a third sound generated by the vibration of the second sub-sound while the case is in contact with the resting surface. The third sound may be interchangeably used with a third sub-sound.

The mobile terminal 300 may receive the first to third sounds through a microphone 322 (S530).

The mobile terminal 300 may transmit first information comprising equalizer parameters and the first to third sounds to a network (S540).

A 5G network may comprise an AI processor or an AI system 1. The AI system 1 of the 5G network may produce an output for updating information related to audio output with second information related to audio output by extracting feature values or feature vectors from the first to third sounds and the first information, which is the basis of the first sound, and applying the extracted feature values or feature vectors to an artificial neural network (ANN)-based learning model 1102 (S551, S552, and S553).

The AI system 1 may compare the second information related to audio output generated based on the output of the learning model 1102 and the first information and update at least one parameter constituting the artificial neural network-based learning model 1102 based on the differences (S544).

If the learning model 1102 satisfies a condition for finishing reinforcement learning, the learning model 1102 whose learning is finished may be stored in a memory (S560: YES, S580). Meanwhile, if the condition for finishing reinforcement learning is not satisfied, the AI system 1 transmits at least one updated parameter to the mobile terminal 300, and the mobile terminal 300 repeats a sound output process based on the received at least one parameter (S570). The AI system 1 and the mobile terminal 300 repeat the above process until the condition for finishing reinforcement learning is satisfied.

Figure 20:
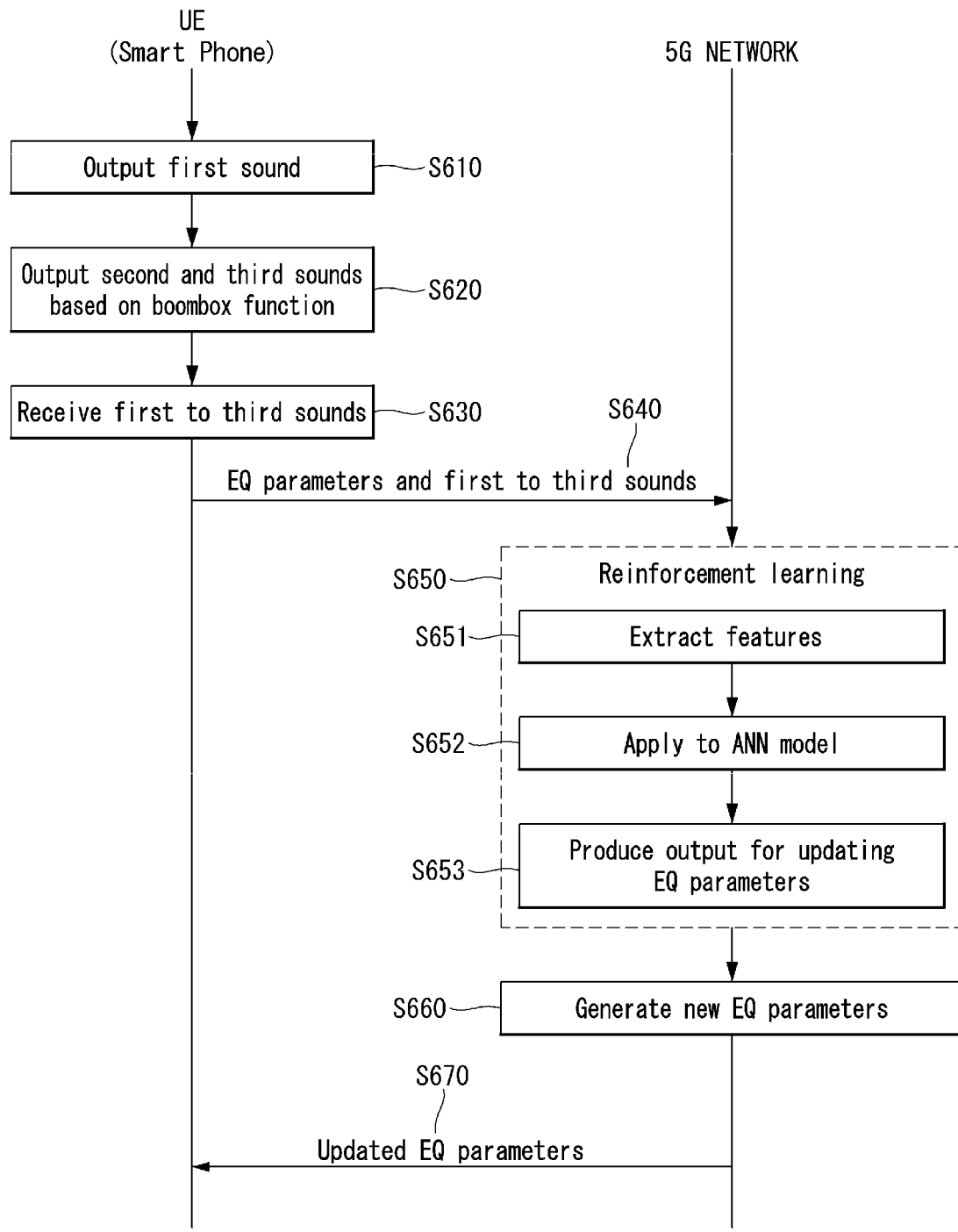
FIG. 20 is a sequence diagram of a method for controlling an equalizer according to another embodiment of the present disclosure.

FIG. 20 is a sequence diagram of a method for controlling an equalizer according to another embodiment of the present disclosure.

Referring to FIG. 20, the mobile terminal 300 may output a first sound through a speaker 352 (S610).

The mobile terminal 300 may output second and third sounds based on the boombox function (S620).

The mobile terminal 300 may receive the first to third sounds through a microphone 322 (S630).

The mobile terminal 300 may transmit first information related to audio output comprising equalizer parameters and the first to third sounds to a network (S640).

A 5G network may comprise an AI processor or an AI system 1. The AI system 1 of the 5G network may produce an output for updating information related to audio output with second information related to audio output by extracting feature values or feature vectors from the first to third sounds and first information, which is the basis of the first sound, and applying the extracted feature values or feature vectors to an artificial neural network (ANN)-based learning model (S651, S652, and S653). The information related to audio output may comprise equalizing parameters for outputting a sound source received from the mobile terminal 300 or another terminal capable of communicating with the mobile terminal 300.

The AI system 1 may generate second information based on the produced output (S660).

The AI system 1 may transmit the generated second information comprising at least one parameter to the mobile terminal 300 (S670). The mobile terminal 300 may receive the second information and output a sound through the speaker 352 based on the received second information.

The above-described disclosure may be implemented in computer-readable code in program-recorded media. The computer-readable media include all types of recording devices storing data readable by a computer system. Example computer-readable media may include hard disk drives (HDDs), solid state disks (SSDs), silicon disk drives (SDDs), ROMs, RAMs, CD-ROMs, magnetic tapes, floppy disks, and/or optical data storage, and may be implemented in carrier waveforms (e.g., transmissions over the Internet). The foregoing detailed description should not be interpreted not as limiting but as an example in all aspects. The scope of the present disclosure should be defined by reasonable interpretation of the appended claims and all equivalents and changes thereto should fall within the scope of the disclosure.

What is claimed is:

1. A method for controlling a mobile terminal, the method comprising:
   generating a first sound based on first information related to audio output;
   generating second information related to the audio output based on the first information and features of the first sound; and
   adjusting a volume or a frequency of a second sound based on the second information and outputting the second sound with adjusted volume or adjusted frequency,
   wherein the first sound comprises a first sub-sound output through a speaker, a second sub-sound output from a case of the mobile terminal that is vibrated by the first sub-sound, and a third sub-sound output by a resting surface that comes in contact with the case of the mobile terminal and is vibrated by vibration of the case of the mobile terminal.

2. The method of claim 1, wherein the first information and the second information include equalizer parameter values for the first sound and the second sound.

3. The method of claim 1, wherein the features of the first sound comprise at least one of a pitch of the first sound, a duration of the first sound and a frequency of the first sound.

4. The method of claim 1, wherein the generating the second information comprises:
   inputting the first information and the features of the first sound to a neural network-based learning model to generate an output by the neural network-based learning model; and
   generating the second information based on the output of the neural network-based learning model.

5. The method of claim 4, further comprising:
   changing a weight or a bias for at least one node in the neural network-based learning model based on one or more differences between the first information and the second information.

6. The method of claim 5, wherein the changing of the weight or the bias for the at least one node comprises:
   generating a reward for reinforcement learning based on the one or more differences between the first information and the second information; and
   changing the weight or the bias for the at least one node based on the reward.

7. The method of claim 4, wherein the neural network-based learning model is stored in a memory of the mobile terminal or in a memory of an AI system configured to communicate with the mobile terminal via a network.

8. The method of claim 7, further comprising:
   receiving an image of the resting surface;
   generating medium information of the resting surface based on the image; and
   providing the medium information of the resting surface to the neural network-based learning model for determining a specific type of medium corresponding to the medium information.

9. The method of claim 8, wherein the image of the resting surface is received from a camera in the mobile terminal or another terminal configured to communicate with the mobile terminal.

10. The method of claim 4, further comprising:
    receiving an image of the resting surface;
    generating medium information of the resting surface based on the image; and
    receiving a particular learning model for determining a specific type of medium corresponding to the medium information or for determining a weight or a bias for at least one node of the particular learning model.

11. The method of claim 10, wherein the receiving the image of the resting surface comprises:
    generating, by a sensor in the mobile terminal, a distance value between the mobile terminal and the resting surface; and
    in response to the distance value being equal to or less than a set reference value, initiating an image receiving process of a camera in the mobile terminal for obtaining the image of the resting surface.

12. The method of claim 10, wherein the generating the second information comprises:
    in response to a brightness of the image of the resting surface becoming less than or equal to a set reference value, executing a second information generating process for generating the second information.

13. A mobile terminal comprising:
    a case forming an exterior of the mobile terminal;
    a speaker configured to generate a first sound based on first information related to audio output; and
    a processor configured to:
      generate second information related to the audio output based on the first information and features of the first sound, and
      adjust a volume or a frequency of a second sound based on the second information and output the second sound with adjusted volume or adjusted frequency,
    wherein the first sound comprises a first sub-sound output through the speaker, a second sub-sound output from the case of the mobile terminal that is vibrated by the first sub-sound, and a third sub-sound output by a resting surface that comes in contact with the case of the mobile terminal and is vibrated by vibration of the case of the mobile terminal.

14. The mobile terminal of claim 13, wherein the first information and the second information include equalizer parameter values for the first sound and the second sound.

15. The mobile terminal of claim 13, wherein the features of the first sound comprise at least one of a pitch of the first sound, a duration of the first sound and a frequency of the first sound.

16. The mobile terminal of claim 13, wherein the processor is further configured to:
input the first information and the features of the first sound to a neural network-based learning model to generate an output by the neural network-based learning model, and
generate the second information based on the output of the neural network-based learning model.

17. The mobile terminal of claim 16, wherein the processor is further configured to:
change a weight or a bias for at least one node in the neural network-based learning model based on one or more differences between the first information and the second information.

18. The mobile terminal of claim 17, wherein the processor is further configured to:
generate a reward for reinforcement learning based on the one or more differences between the first information and the second information; and
change the weight or the bias for the at least one node based on the reward.

19. The mobile terminal of claim 16, wherein the learning model is stored in a memory of the mobile terminal or in a memory of an AI system configured to communicate with the mobile terminal via a network.

20. A non-transitory recording medium readable by a computer system, the non-transitory recording medium having a program recorded therein to execute the method of claim 1 in the computer system.

* * * * *